United States Patent
Shimura

(10) Patent No.: US 8,018,271 B2
(45) Date of Patent: *Sep. 13, 2011

(54) SEMICONDUCTOR INTEGRATED CIRCUIT

(75) Inventor: Hidekichi Shimura, Tokyo (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/835,526

(22) Filed: Jul. 13, 2010

(65) Prior Publication Data

US 2011/0006827 A1 Jan. 13, 2011

Related U.S. Application Data

(63) Continuation of application No. 12/367,957, filed on Feb. 9, 2009, now Pat. No. 7,782,125.

(30) Foreign Application Priority Data

Feb. 20, 2008 (JP) .............................. P. 2008-039228

(51) Int. Cl.
*G05F 1/10* (2006.01)
(52) U.S. Cl. ......... 327/544; 327/198; 327/199; 327/261
(58) Field of Classification Search .................. 327/142, 327/198, 199, 530, 544, 261
See application file for complete search history.

(56) References Cited

U.S. PATENT DOCUMENTS

| | | | |
|---|---|---|---|
| 5,027,085 A * | 6/1991 | DeVito | 331/1 A |
| 5,745,375 A | 4/1998 | Reinhardt et al. | |
| 6,868,503 B1 | 3/2005 | Maksimovic et al. | |
| 6,901,339 B2 * | 5/2005 | Eskeldson et al. | 702/64 |
| 7,257,723 B2 * | 8/2007 | Galles | 713/321 |

(Continued)

FOREIGN PATENT DOCUMENTS

JP 2006-060086 3/2006

(Continued)

OTHER PUBLICATIONS

Flautner, Krisztian et al.,"A Combined Hardware-Software Approach for Low-Power SoCs: Applying Adaptive Voltage Scaling and Intelligent Energy management Software," Design 2003 (System-on-Chip and ASIC Design Conference.

(Continued)

*Primary Examiner* — Long Nguyen
(74) *Attorney, Agent, or Firm* — McDermott Will & Emery LLP

(57) ABSTRACT

A semiconductor integrated circuit includes: a first flip-flop, a combined circuit and a second flip-flop that form a critical path; a first delay circuit and a third flip-flop that are provided in the post-stage of the combined circuit; a second delay circuit and a fourth flip-flop that are provided in the post-stage of the combined circuit; a first comparison circuit that compares the output of the second flip-flop with the output of the third flip-flop; a second comparison circuit that compares the output of the second flip-flop with the output of the fourth flip-flop: and a control circuit that controls a source voltage supplied to the combined circuit in accordance with the outputs of the comparison circuits. A delay time by the first delay circuit is different from a delay time by the second delay circuit.

10 Claims, 15 Drawing Sheets

U.S. PATENT DOCUMENTS

| | | | |
|---|---|---|---|
| 7,278,080 | B2 | 10/2007 | Flautner et al. |
| 7,782,125 | B2 * | 8/2010 | Shimura ............... 327/544 |
| 2009/0206904 | A1 | 8/2009 | Shimura |
| 2010/0019818 | A1 | 1/2010 | Priel et al. |
| 2010/0045364 | A1 | 2/2010 | Law et al. |
| 2010/0090738 | A1 | 4/2010 | Changchein et al. |

FOREIGN PATENT DOCUMENTS

| | | |
|---|---|---|
| JP | 2007-249308 | 9/2007 |

OTHER PUBLICATIONS

Fujiyoshi, Toshihide et al., An H.264/MPEG-4 Audio/Visual Codec LSI with Module-Wise Dynamic Voltage/Frequency Scaling, 2005 IEEE International Solid-State Circuits Conference, Dig. Tech, Papers, pp. 132-133.

Sato, Toshinori et al., "A Simple Flip-Flop Circuit for Typical-Case Designs for DFM," 8th International Symposium on Quality Electronic Design, 2007.

* cited by examiner

SEMICONDUCTOR INTEGRATED CIRCUIT

RELATED APPLICATIONS

This application is a Continuation of U.S. application Ser. No. 12/367,957, filed on Feb. 9, 2009, now U.S. Pat. No. 7,782,125, claiming priority of Japanese Patent Application No. 2008-039228, filed on Feb. 20, 2008, the entire contents of each of which are hereby incorporated by reference.

BACKGROUND OF THE INVENTION

1. Field of the Invention

The present invention relates to a semiconductor integrated circuit using an AVS (Adaptive Voltage Scaling) technique or a DVS (Dynamic Voltage Scaling) technique suitable for reducing an electric power consumption.

2. Description of the Related Art

Since a pace has been continuously kept for ten years or more that improves a degree of integration of a semiconductor to four times as high as that of a first year in three years, the scale of a semiconductor integrated circuit is enormously large and a method for constructing chips of the semiconductor integrated circuit has been greatly changed.

FIG. 15 is a block diagram showing the structure of a system LSI. In FIG. 15, a semiconductor integrated circuit 600 includes a general-purpose CPU 611, a DSP (Digital Signal Processor) 612, a special-purpose circuit 613, a special-purpose circuit 614, an SDRAM (Synchronous Dynamic TAM) control circuit 615 and a DMA (Direct Memory Access) controller 616. These members are mutually connected through a common bus 617. The CPU 611 and the DSP 612 respectively have an inner memory 611a and an inner memory 612a in inner parts thereof. In the semiconductor integrated circuit 500, an SDRAM 618 of a large capacity is ordinarily prepared in an external part.

Even at the present time, there is a possibility that a request for functions mounted on the semiconductor integrated circuit rapidly changes every day. When a part of the functions is formed as the special-purpose circuit 613 or the special-purpose circuit 614 as shown in FIG. 15, such a change of the request may not be possibly rapidly met.

Therefore, at the present stage, as shown in FIG. 16, functions mainly composed of a calculating function except the general-purpose CPU are formed in the structures of "multi-function DSP+an expanded function" and a specification that may possibly change is progressively met by software on the multifunction DSP.

FIG. 16 is a block diagram showing such a system LSI. In FIG. 16, a semiconductor integrated circuit 700 includes a general-purpose CPU 711, a calculating function part 723 having a multifunction DSP 721 and an expanded function 722, a calculating function part 726 having a multifunction part 724 and an expanded function 725, an SDRAM control circuit 715, a DMA controller 716, local buses 727 to 729 arranged in the side of the function parts respectively, a global bus 730 arranged in the side of the SDRAM control circuit 715 and the DMA controller 716 and bus bridges 731 to 733 for connecting the local buses 727 to 729 to the global bus 730. The multifunction DSP 721 has an inner memory 721a. In the structures of the buses, the local buses 727 to 729 are allocated to the function parts respectively. In the SDRAM control circuit 715 side, the global bus 730 is arranged. Between the local buses 727 to 729 and the global bus 730, the bus bridges 731 to 733 are arranged.

With the progress of a semiconductor process in the future, when many functions are increasingly mounted on the semiconductor integrated circuit, the structure of the semiconductor integrated circuit will be further changed as shown in FIG. 17.

FIG. 17 is a block diagram showing another structure of a system LSI. In FIG. 17, a semiconductor integrated circuit 800 includes one general-purpose CPU 811, four general purpose calculating processors 841 to 844 having inner memories 841a to 844a, an SDRAM control circuit 815, a DMA controller 816, an I/O control circuit 845 for controlling a peripheral I/O group 860, a local bus 846 arranged in the side of the CPU 811 and the I/O control circuit 845, local buses 847 to 850 arranged in the side of the general-purpose calculating processors 841 to 844, a global bus 851 arranged between the local bus 846 and the local buses 847 to 850, bus bridges 852 to 855 for connecting the local buses 847 to 850 to the global bus 851 and a bus bridge 856 for connecting the local bus 846 to the global bus 851.

In the semiconductor integrated circuit 800, the one general-purpose CPU 811 and several (four to eight or so) general-purpose calculating processors 841 to 844 are connected together through the local buses 846 to 850, the global bus 851 and the bus bridges 852 to 856. An SDRAM 818 of a large capacity is arranged in an external part. The SDRAM control circuit 815 adjusts the general-purpose CPU 811, the several calculating processors 841 to 844 and the DMA controller 816 or the like relative to the SDRAM 818.

As described above, when the degree of integration of the semiconductor integrated circuit is enhanced, a problem of a consumed electric power arises that increases during an operation or a stand-by as the most serious problem. As a method for solving this problem, there is a DVS (Dynamic Voltage Scaling) technique or an AVS (Adaptive Voltage Scaling) technique as the technique that most attracts an attention. Since the contents of these techniques are described in detail in below-described documents (for instance, Patent Documents 1 and 2 and Non-Patent Documents 1 and 2), an explanation thereof will be omitted.

However, the above-described usual semiconductor integrated circuits have problems as described below.

According to the Non-Patent Document 1, the AVS technique has a great restricted matter under existing circumstances. The present AVS technique is adopted on the assumption that this technique is used for all chips. In this case, all the chips change source voltages and system clock frequencies corresponding thereto at the same time. Namely, in this system, the source voltages of the chips and the system clock frequencies change on the basis of a time base, and the CPU controls the source voltage of the chip to be raised (for instance, VDD=1.5 V) and the system clock frequency to be also raised (for instance, fclk=400 MHz) when an amount of a load of a work is large. Further, when an amount of a load of the work is small, the CPU controls the source voltage of the chip to be lowered (for instance, VDD=1.0 V) and the system clock frequency to be also lowered (for instance, fclk=200 MHz). In such a way, the electric power consumed in the chips can be reduced. Ordinarily, in the system LSI, various kinds of functional blocks such as a video signal processing block, an audio signal processing block, a control signal processing block or the like are provided and a large difference exists in an amount of a load of a work required for a process between these functional blocks.

As a related art that tries to solve the above-described problem, the Non-Patent Document 2 is exemplified. Here, the source voltage of the audio signal processing block can be selected from 0.9 V/1.2 V and the system clock frequency can be selected from 90 MHz/180 MHz, however, for other blocks than the audio signal processing block (here, the video signal processing block or the like is provided), the source voltage is fixed to 1.2 V and the system clock frequency is fixed to 180 MHz.

In accordance with the above-description, in the functional blocks respectively, to what source voltage the source voltage is set and to what operating frequency the frequency is set correspondingly to the contents of the works respectively for a multifunction DSP are determined in accordance with a previous minute and careful simulation. However, when the inner circuit of each block of the multifunction DSP is investigated, various delay paths exist in the circuit. The value of the source voltage necessary for executing a specific work in the multifunction DSP is determined by a group of delay paths called as a critical path among the various delay paths existing in the functional block. Assuming that the operating frequency is constant while a certain work is carried out, the source voltage value needs to have a margin in order to provide a margin for the operation of the multifunction DSP.

When the consumed electric power of the multifunction DSP is tried to be reduced, the source voltage value of the multifunction DSP to be set may be set to the lowest value that can pass at all costs the critical path whose delay value is the largest. However, it is very difficult to determine such a subtle setting even by a previous minute and careful simulation.

As a usual technique for realizing the delicate setting of the source voltage value, a canary flip-flop shown in FIG. 18 that is disclosed in Patent Document 3 is devised. In FIG. 18, a signal 901 initially synchronizes with a clock signal 902 and is taken into a flip-flop 903. In a next clock period, the signal is delayed by a combined circuit 904 and then taken into a flip-flop 905 (refer it to as a "main FF 905", hereinafter.). A signal obtained by delaying the signal that is delayed by the combined circuit 904 by a specific time by a delay element 907 is taken to a flop-flop 908 (refer it to as a "canary FF 908", hereinafter.). The signal from the main FF 905 is compared with the signal from the canary FF 908 by a comparison circuit 909 formed with an Exclusive-OR circuit. When values held by the main FF 905 and the canary FF 908 are different from each other, this indicates that when the signal 901 is delayed by a delay value of the delay element 907 from a present state, the signal 901 generates a malfunction. That is, a timing error can be anticipated in accordance with the structure of the canary FF. When an output of the comparison circuit 909 is "1" by the delay value of the delay element 907 corresponding to a necessary margin, this indicates that a sufficient margin is not provided for the source voltage value of the block of the multifunction DSP from the viewpoint of the margin. Therefore, a control needs to be carried out so as to raise the source voltage value VDD 950 of the block of the multifunction DSP.

Patent Document 1: U.S. Pat. No. 5,745,375
Patent Document 2: U.S. Pat. No. 6,868,503
Patent Document 3: JP-A-2004-241466
Patent Document 4: JP-A-2006-68400
Non-Patent Document 1: "A Combined Hardware-Software Approach for Low-Power SoC: Applying Adaptive Voltage Scaling and Intelligent Energy management Software", Design 2003 (System-on-Chip and ASIC Design Conference)
Non-Patent Document 2: "An H. 264/MPEG-4 Audio/Visual Codec LSI with Module-Wise Dynamic Voltage/Frequency Scaling", ISSCC2005 Dig. Tech, Papers, pp. 132-133
Non-Patent Document 3: T. Sato and Y Kunitake "A Simple Flip-Flop Circuit for Typical-Case Designs for DFM" 8 th International Symposium on Quality Electronic Design, 2007

The control of the multifunctional DSP block using the above-described canary FF is an effective method for setting the source voltage value that can be hardly determined by a previous minute and careful simulation, however, this method has below-described problems.

(1) Problem 1

In the Non-Patent Document 3, when the output of the comparison circuit 909 is "1", this indicates that a sufficient margin is not provided for the source voltage value of the block of the multifunction DSP. Therefore, such a control is carried out as to raise the source voltage value VDD 950 of the block of the multifunction DSP. In the Non-Patent Document 3, the source voltage of the entire part of the block of the multifunction DSP is raised. Accordingly, the source voltages of most of circuits that are not the critical path are also raised, which is not preferable in view of the reduction of the consumed electric power of the semiconductor integrated circuit.

(2) Problem 2

In the structure for controlling the source voltage value of the block of the multifunction DSP using the canary FF disclosed in the Non-patent Document 3, even when the margin of the critical path is desired to be set to a value between 10% and 20%, it cannot be realized.

As described above, in controlling the source voltage value of the block of the multifunction DSP using the canary FF, the two large problems as mentioned above arise.

SUMMARY OF THE INVENTION

It is an object of the present invention to provide a semiconductor integrated circuit that realizes an AVS (Adaptive Voltage Scaling) technique or a DVS (Dynamic Voltage Scaling) technique suitable for reducing a consumed electric power.

The present invention provides a semiconductor integrated circuit having a critical path. The semiconductor integrated circuit comprises: a first flip-flop, a combined circuit and a second flip-flop that are connected in series and form the critical path; a first delay circuit and a third flip-flop connected in series that are provided in parallel with the second flip-flop in the post-stage of the combined circuit; a second delay circuit and a fourth flip-flop connected in series that are provided in parallel with the second flip-flop in the post-stage of the combined circuit; a first comparison circuit that compares the output of the second flip-flop with the output of the third flip-flop; a second comparison circuit that compares the output of the second flip-flop with the output of the fourth flip-flop: and a control circuit that controls a source voltage supplied to the combined circuit in accordance with the output of the first comparison circuit and the output of the second comparison circuit, wherein the first delay circuit outputs a signal inputted from the combined circuit after a first delay time and the second delay circuit outputs a signal inputted from the combined circuit after a second delay time different from the first delay time.

In the semiconductor integrated circuit, the first delay time is a value 5% to 30% as long as a delay time from the first flip-flop to the second flip-flop.

In the semiconductor integrated circuit, the second delay time is a value 105% to 130% as long as the first delay time.

In the semiconductor integrated circuit, when the output of the first comparison circuit shows a "mismatch" of two input signals and the output of the second comparison circuit shows a "mismatch" of two input signals, the control circuit controls the source voltage supplied to the combined circuit to be raised.

In the semiconductor integrated circuit, when the output of the first comparison circuit shows a "match" of the two input signals and the output of the second comparison circuit shows a "mismatch" of the two input signals, the control circuit controls the source voltage supplied to the combined circuit to be held.

In the semiconductor integrated circuit, when the output of the first comparison circuit shows a "match" of the two input signals and the output of the second comparison circuit shows a "match" of the two input signals, the control circuit controls the source voltage supplied to the combined circuit to be lowered.

In the semiconductor integrated circuit, an equal source voltage is supplied to the first flip-flop and the second flip flop and the source voltage is lower than the source voltage supplied to the combined circuit.

In the semiconductor integrated circuit, the control circuit controls the source voltage supplied to the combined circuit to be "raised", "held or "lowered".

In the semiconductor integrated circuit, the control circuit sets the initialization of the source voltage supplied to the combined circuit to be "held".

The semiconductor integrated circuit further comprises: a third delay circuit and a fifth flip-flop connected in series that are provided in parallel with the second flip-flop in the post-stage of the combined circuit; a fourth delay circuit and a sixth flip-flop connected in series that are provided in parallel with the second flip-flop in the post-stage of the combined circuit; a third comparison circuit that compares the output of the second flip-flop with the output of the fifth flip-flop; and a fourth comparison circuit that compares the output of the second flip-flop with the output of the sixth flip-flop. The control circuit controls the source voltage supplied to the combined circuit in accordance with the output of the first comparison circuit, the output of the second comparison circuit, the output of the third comparison circuit and the output of the fourth comparison circuit and the first delay time, the second delay time, a third delay time by the third delay circuit and a fourth delay time by the fourth delay circuit are respectively different.

According to the present invention, the semiconductor integrated circuit can realize the DVS (Dynamic Voltage Scaling) technique or the AVS (Adaptive Voltage Scaling) technique in an optimum form and more effectively reduce a consumed electric power.

DESCRIPTION OF THE PREFERRED EMBODIMENTS

Figure 1:
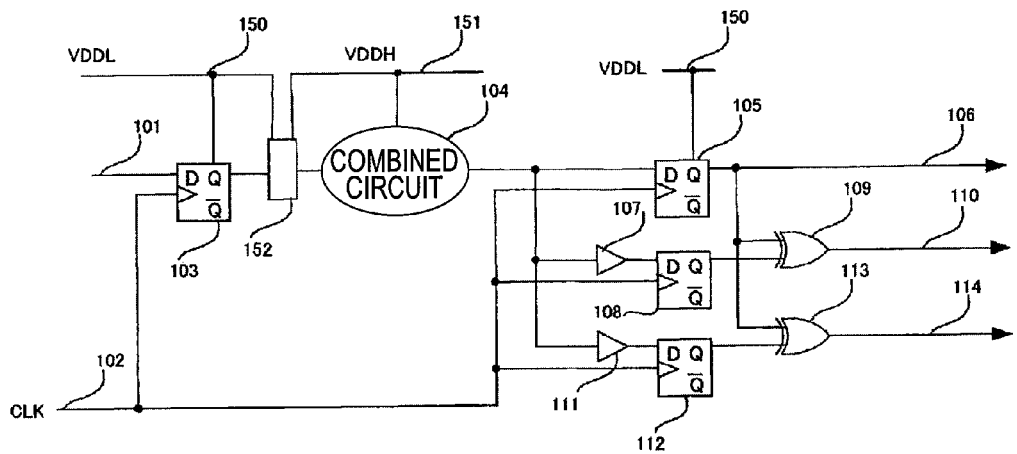
FIG. 1 is a block diagram showing the structure of a semiconductor integrated circuit according to a first embodiment of the present invention.

Now, embodiments of the present invention will be described below by referring to the drawings.

First Embodiment

FIG. 1 is a diagram showing the structure of a semiconductor integrated circuit according to a first embodiment of the present invention. As shown in FIG. 1, the semiconductor integrated circuit of this embodiment includes two canary FFs 108 and 112.

In FIG. 1, a signal 101 is initially synchronized with a clock signal 102 and taken to a flip-flop 103. In a next clock period, the signal is delayed by a level shifter 152 for converting a voltage level between different voltages and a combined circuit 104, and then taken to a flop-flop 105 (refer it to as a "main FF 105" hereinafter.). A signal obtained by delaying the signal that is delayed by the level shifter 152 and the combined circuit 104 by a specific delay time T1 by a first delay element 107 is taken to a flip-flop 108 (refer it to as a "first canary FF 108" hereinafter.). The signal from the main FF 105 is compared with the signal from the first canary FF 108 by a first Exclusive-OR (mismatch circuit) 109. A compared result is outputted as a compared result signal 110.

Further, a signal obtained by delaying the signal that is delayed by the level shifter 152 and the combined circuit 104 by a specific delay time T2 by a second delay element 111 is taken to a flip-flop 112 (refer it to as a "second canary FF 112" hereinafter.). The signal from the main FF 105 is compared with the signal from the second canary FF 112 by a second Exclusive-OR (mismatch circuit) 113. A compared result is outputted as a compared result signal 114.

Here, the specific delay time T1 by the first delay element 107 is set to a value 10% as long as a delay time from the flip flop 103 to the flip-flop 105 and the specific delay time T2 by the second delay element 111 is set to a value 20% as long as the delay time from the flip-flop 103 to the flip-flop 105.

When the specific delay time T1 and the specific delay time T2 are set in such a way, a source voltage value VDDH supplied to the level shifter 152 and the combined circuit 104 is controlled as illustrated in a below-shown Table 1 in accordance with the combination of the value of the compared result signal 110 and the value of the compared result signal 114. In FIG. 1, the source voltage value VDDH supplied to the level shifter 152 and the combined circuit 104 is set to a voltage value higher than a source voltage value VDDL supplied to other parts than the combined circuit 104.

In the Table 1, a case represented by X is not ordinarily present. That is, the case that the value of the compared result signal 110 is "1" and the value of the compared result signal 114 is "0" is not ordinarily present.

TABLE 1

|  | Value of compared result signal 110 "1" | Value of compared result signal 110 "0" |
|---|---|---|
| Value of compared result signal 114 "1" | Raise source voltage value VDDH (1) | Hold source voltage value VDDH (2) |
| Value of compared result signal 114 "0" | X | Lower source voltage value VDDH (3) |

A method for controlling the source voltage value VDDH in accordance with the combination of the value of the compared result signal 110 and the value of the compared result signal 114 can be summarized as described below. A table according to this method is shown in Table 2.

In the Case of (1):

When the value of the compared result signal 110 is "1" and the value of the compared result signal 114 is "1", that is, when the source voltage value VDDH cannot pass even a margin of 10%, since a real margin is less than 10%, the source voltage value VDDH is controlled to be raised. As a result, the real margin is increased.

In the Case of (2):

When the value of the compared result signal 110 is "0" and the value of the compared result signal 114 is "1", that is, when the source voltage value VDDH can pass the margin of 10%, however, the source voltage VDDH cannot pass a margin of 20%, since a real margin is 10% or more and 20% or less, the source voltage value VDDH is controlled to be held.

In the Case of (3):

When the value of the compared result signal 110 is "0" and the value of the compared result signal 114 is "0", that is, when the source voltage value VDDH can pass even a margin of 20%, since a real margin is more than 20%, the source voltage value VDDH is controlled to be lowered. As a result, the real margin is decreased.

TABLE 2

|  | Value of compared result signal 110 | Value of compared result signal 114 | Contents of control |
|---|---|---|---|
| In the case of (1) | "1" | "1" | Raise source voltage value VDDH |
| In the case of (2) | "0" | "1" | Hold source voltage value VDDH |
| In the case of (3) | "0" | "0" | Lower source voltage value VDDH |

The source voltage value VDDH supplied to the level shifter 152 and the combined circuit 104 is controlled as shown in the Table 1 and the Table 2 in accordance with the combination of the value of the compared result signal 110 and the value of the compared result signal 114. Thus, the margin of a critical path can be set to a value ranging from 10% to 20%.

This structure is applied respectively to critical paths so that all the critical paths can be individually met. Thus, the problem 2 is solved.

As can be understood from a circuit diagram shown in FIG. 1, in order to ensure the margin of the delay time, a circuit structure is provided in which only the source voltage value VDDH of the combined circuit 104 forming the critical path is raised without raising the source voltage of the entire part of a block of a multifunction DSP. Therefore, the source voltage value of a delay path that does not form the critical path is set to the source voltage value VDDL lower than the source voltage value VDDH. Accordingly, since the source voltages of most of the circuits that are not the critical path are not raised, this is preferable in view of reducing a consumed electric power. Thus, the problem 1 is also solved.

As mentioned above, the case that there are two canary FFs including the first canary FF 108 and the second canary 112 is explained. However, when a structure having four canary FFs is formed, the margin of the critical path can be more finely set by taking a step forward, as compared with the structure having the two canary FFs in which the margin of the critical path can be merely set to a value ranging from 10% to 20%. Accordingly, a consumed electric power can be more reduced.

Second Embodiment

Figure 2:
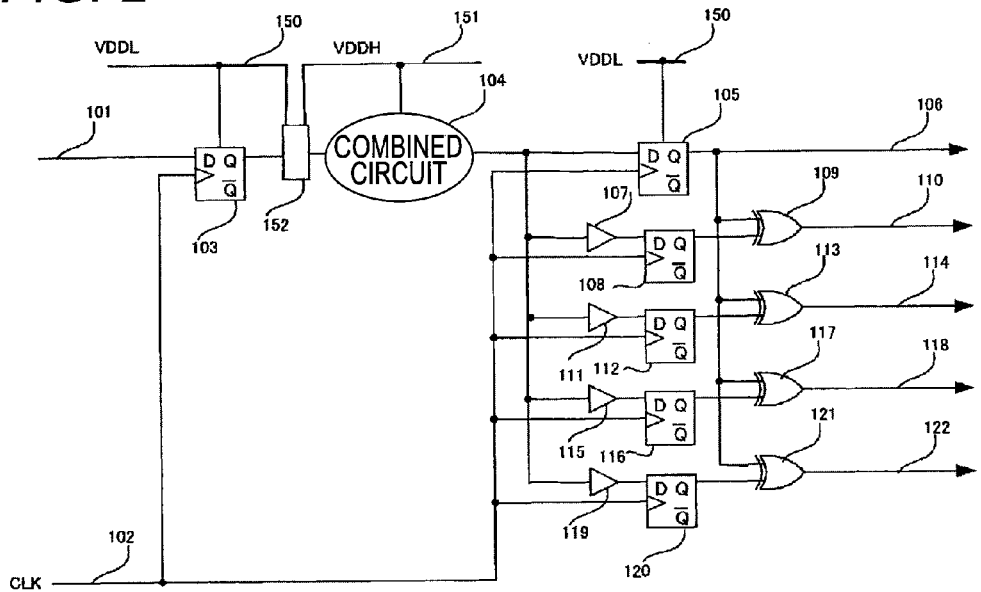
FIG. 2 is a block diagram showing the structure of a semiconductor integrated circuit according to a second embodiment of the present invention.

FIG. 2 is a diagram showing the structure of a semiconductor integrated circuit according to a second embodiment of the present invention. As shown in FIG. 2, the semiconductor integrated circuit of this embodiment includes four canary FFs 108, 112, 116 and 120.

In FIG. 2, a signal 101 is initially synchronized with a clock signal 102 and taken to a flip-flop 103. In a next clock period, the signal is delayed by a level shifter 152 and a combined circuit 104, and then taken to a flop-flop 105 (refer it to as a "main FF 105" hereinafter.). A signal obtained by delaying the signal that is delayed by the level shifter 152 and the combined circuit 104 by a specific delay time TT1 by a first delay element 107 is taken to a flip-flop 108 (refer it to as a "first canary FF 108" hereinafter.). The signal from the main FF 105 is compared with the signal from the first canary FF 108 by a first Exclusive-OR (mismatch circuit) 109. A compared result is outputted as a compared result signal 110.

Further, a signal obtained by delaying the signal that is delayed by the level shifter 152 and the combined circuit 104 by a specific delay time TT2 by a second delay element 111 is taken to a flip-flop 112 (refer it to as a "second canary FF 112"

hereinafter.). The signal from the main FF 105 is compared with the signal from the second canary FF 112 by a second Exclusive-OR (mismatch circuit) 113. A compared result is outputted as a compared result signal 114.

Further, a signal obtained by delaying the signal that is delayed by the level shifter 152 and the combined circuit 104 by a specific delay time TT3 by a third delay element 115 is taken to a flip-flop 116 (refer it to as a "third canary FF 116" hereinafter.). The signal from the main FF 105 is compared with the signal from the third canary FF 116 by a third Exclusive-OR (mismatch circuit) 117. A compared result is outputted as a compared result signal 118.

Further, a signal obtained by delaying the signal that is delayed by the level shifter 152 and the combined circuit 104 by a specific delay time TT4 by a fourth delay element 119 is taken to a flip-flop 120 (refer it to as a "fourth canary FF 120" hereinafter.). The signal from the main FF 105 is compared with the signal from the fourth canary FF 120 by a fourth Exclusive-OR (mismatch circuit) 121. A compared result is outputted as a compared result signal 122.

Here, the specific delay time TT1 by the first delay element 107 is set to a value 5% as long as a delay time from the flip flop 103 to the flip-flop 105 and the specific delay time TT2 by the second delay element 111 is set to a value 10% as long as the delay time from the flip-flop 103 to the flip-flop 105. The specific delay time TT3 by the third delay element 115 is set to a value 15% as long as a delay time from the flip flop 103 to the flip-flop 105 and the specific delay time TT4 by the fourth delay element 119 is set to a value 20% as long as the delay time from the flip-flop 103 to the flip-flop 105.

When the specific delay time TT1, the specific delay time TT2, the specific delay time TT3 and the specific delay time TT4 are set in such a way, a source voltage value VDDH supplied to the level shifter 152 and the combined circuit 104 is controlled as illustrated in a below-shown Table 3 in accordance with the combination of the value of the compared result signal 110, the value of the compared result signal 114, the value of the compared result signal 118 and the value of the compared result signal 122. In FIG. 2, the source voltage value VDDH supplied to the level shifter 152 and the combined circuit 104 is set to a voltage value higher than a source voltage value VDDL supplied to other parts than the combined circuit 104.

In the Table 3, a case represented by X is not ordinarily present. As shown in the Table 3, four cases are not ordinarily present.

TABLE 3

| | Value of compared result signal 110 "1" and value of compared result signal 114 "1" | Value of compared result signal 110 "0" and value of compared result signal 114 "1" | Value of compared result signal 110 "0" and value of compared result signal 114 "1" | Value of compared result signal 110 "0" and value of compared result signal 114 "0" |
|---|---|---|---|---|
| Value of compared result signal 118 "1" and value of compared result signal 122 "1" | Raise source voltage value VDDH (1) | Raise source voltage value VDDH (2) | X | Hold source voltage value VDDH (3) |
| Value of compared result signal 118 "0" and value of compared result signal 122 "1" | X | X | X | Lower source voltage value VDDH (4) |
| Value of compared result signal 118 "1" and value of compared result signal 122 "0" | X | X | X | X |
| Value of compared result signal 118 "0" and value of compared result signal 122 "0" | X | X | X | Lower source voltage value (5) |

A method for controlling the source voltage value VDDH in accordance with the combination of the value of the compared result signal 110, the value of the compared result signal 114, the value of the compared result signal 118 and the value of the compared result signal 122 can be summarized as described below. A table according to this method is shown in Table 4.

In the Case of (1):

When the value of the compared result signal 110 is "1", the value of the compared result signal 114 is "1", the value of the compared result signal 118 is "1" and the value of the compared result signal 122 is "1", that is, when the source voltage value VDDH fails even for a margin of 5%, since a real margin is less than 5%, the source voltage value VDDH is controlled to be raised. As a result, the real margin is increased.

In the Case of (2):

When the value of the compared result signal 110 is "0", the value of the compared result signal 114 is "1", the compared result signal 118 is "1" and the value of the compared result signal 122 is "1", that is, when the source voltage value VDDH can pass only the margin of 5%, since a real margin is 5% or more and 10% or less, the source voltage value VDDH is controlled to be raised. As a result, the real margin is increased.

In the Case of (3):

When the value of the compared result signal 110 is "0", the value of the compared result signal 114 is "0", the value of the compared result signal 118 is "1" and the value of the compared result signal 122 is "1", that is, when the source voltage value VDDH can pass only the margin of 10% or less, since a real margin is 10% or more and 15% or less, the source voltage value VDDH is controlled to be held.

In the Case of (4)

When the value of the compared result signal 110 is "0", the value of the compared result signal 114 is "0", the value of the compared result signal 118 is "0" and the value of the compared result signal 122 is "1", that is, when the source voltage value VDDH can pass only the margin of 15% or less, since a real margin is 15% or more and 20% or less, the source voltage value VDDH is controlled to be lowered. As a result, the real margin is decreased.

In the Case of (5)

When the value of the compared result signal 110 is "0", the value of the compared result signal 114 is "0", the value of the compared result signal 118 is "0" and the value of the compared result signal 122 is "0", that is, when the source voltage value VDDH can pass the margin of 20% or less, since a real margin is 20% or more, the source voltage value VDDH is controlled to be lowered. As a result, the real margin is decreased.

TABLE 4

| | Value of compared result signal 112 | Value of compared result signal 114 | Value of compared result signal 118 | Value of compared result signal 122 | Contents of control |
|---|---|---|---|---|---|
| In the case of (1) | "1" | "1" | "1" | "1" | Raise source voltage value VDDH |
| In the case of (2) | "0" | "1" | "1" | "1" | Raise source voltage value VDDH |
| In the case of (3) | "0" | "0" | "1" | "1" | Hold source voltage value VDDH |
| In the case of (4) | "0" | "0" | "0" | "1" | Lower source voltage value VDDH |
| In the case of (5) | "0" | "0" | "0" | "0" | Lower source voltage value VDDH |

The source voltage value VDDH supplied to the level shifter 152 and the combined circuit 104 is controlled as shown in the Table 3 and the Table 4 in accordance with the combination of the value of the compared result signal 110, the value of the compared result signal 114, the value of the compared result signal 118 and the value of the compared result signal 122. Thus, the margin of a critical path can be set to a value ranging from 10% to 15%.

This structure is applied respectively to critical paths so that all the critical paths can be individually met. Thus, the problem 2 is solved more accurately than the first embodiment.

As can be understood from a circuit diagram shown in FIG. 2, in order to ensure the margin of the delay time in the second embodiment as in the first embodiment shown in FIG. 1, a circuit structure is provided in which only the source voltage value VDDH of the combined circuit 104 forming the critical path is raised without raising the source voltage of the entire part of a block of a multifunction DSP. Therefore, the source voltage value of a delay path that does not form the critical path is set to the source voltage value VDDL lower than the source voltage value VDDH. Accordingly, since the source voltages of most of the circuits that are not the critical path are not raised, this is preferable in view of reducing a consumed electric power. Thus, the problem 1 is also solved.

Figure 3:
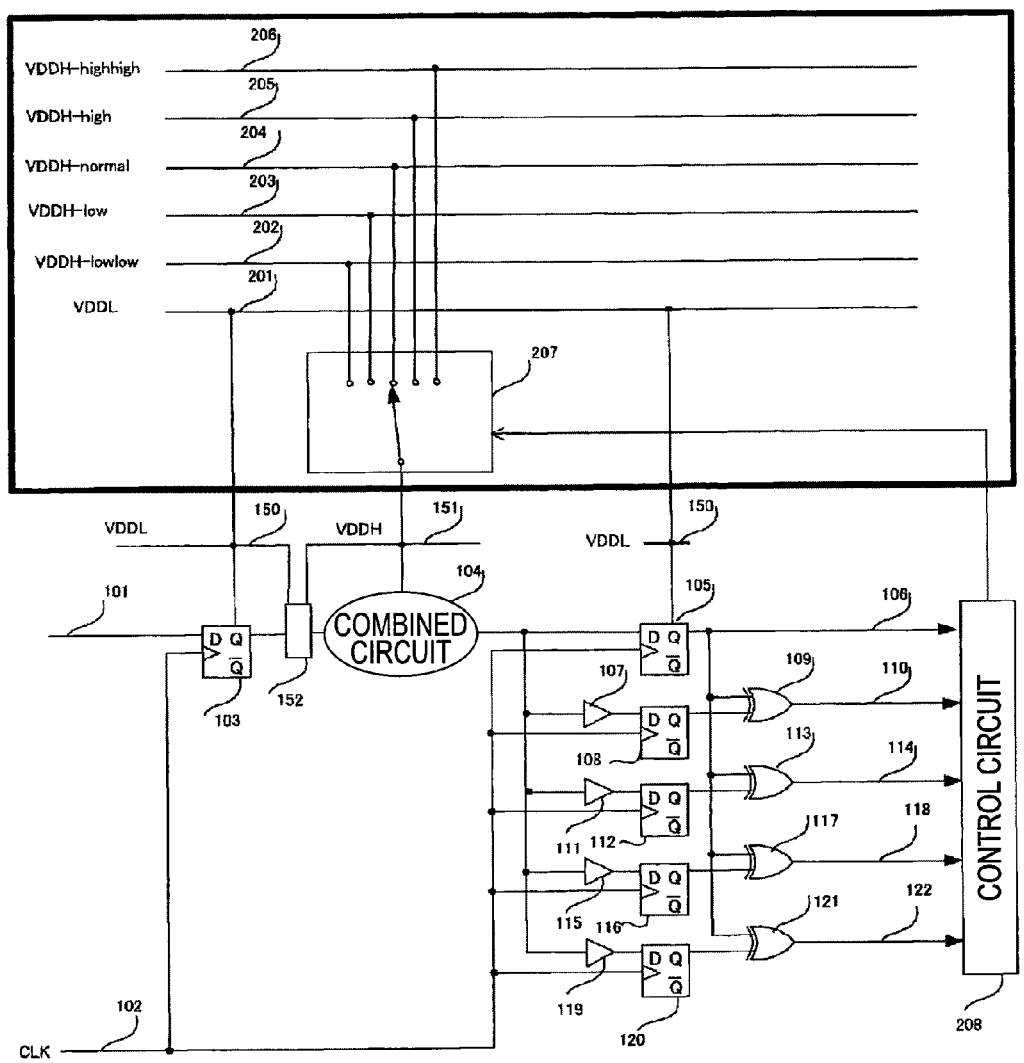
FIG. 3 is a block diagram showing how the source voltage value VDDH of a combined circuit 104 forming a critical path is changed in a structure having four canary FFs.

FIG. 3 is a block diagram showing how the source voltage value VDDH of a combined circuit 104 that forms a critical path is changed in the case of a structure having four canary FFs. In FIG. 3, since members designated by the same reference numerals as those of FIG. 2 carry out the same operations as those described in FIG. 2, an explanation thereof will be omitted.

Reference numeral 201 designates a power cable for supplying a source voltage value VDDL. Reference numerals 202, 203, 204, 205 and 206 respectively show power cables for supplying a source voltage value VDDH-lowlow, a source voltage value VDDH-low, a source voltage value VDDH-normal, a source voltage value VDDH-high and a source voltage value VDDH-highhigh. Reference numeral 208 designates a control circuit such as a CPU for controlling a switch part 207 for switching a source voltage value VDDH supplied to a level shifter 152 and a combined circuit 104 in accordance with the combination of the value of a compared result signal 110, the value of a compared result signal 114, the value of a compared result signal 118 and the value of a compared result signal 122 as shown in the Table 3 and the Table 4.

Third Embodiment

Figure 4:
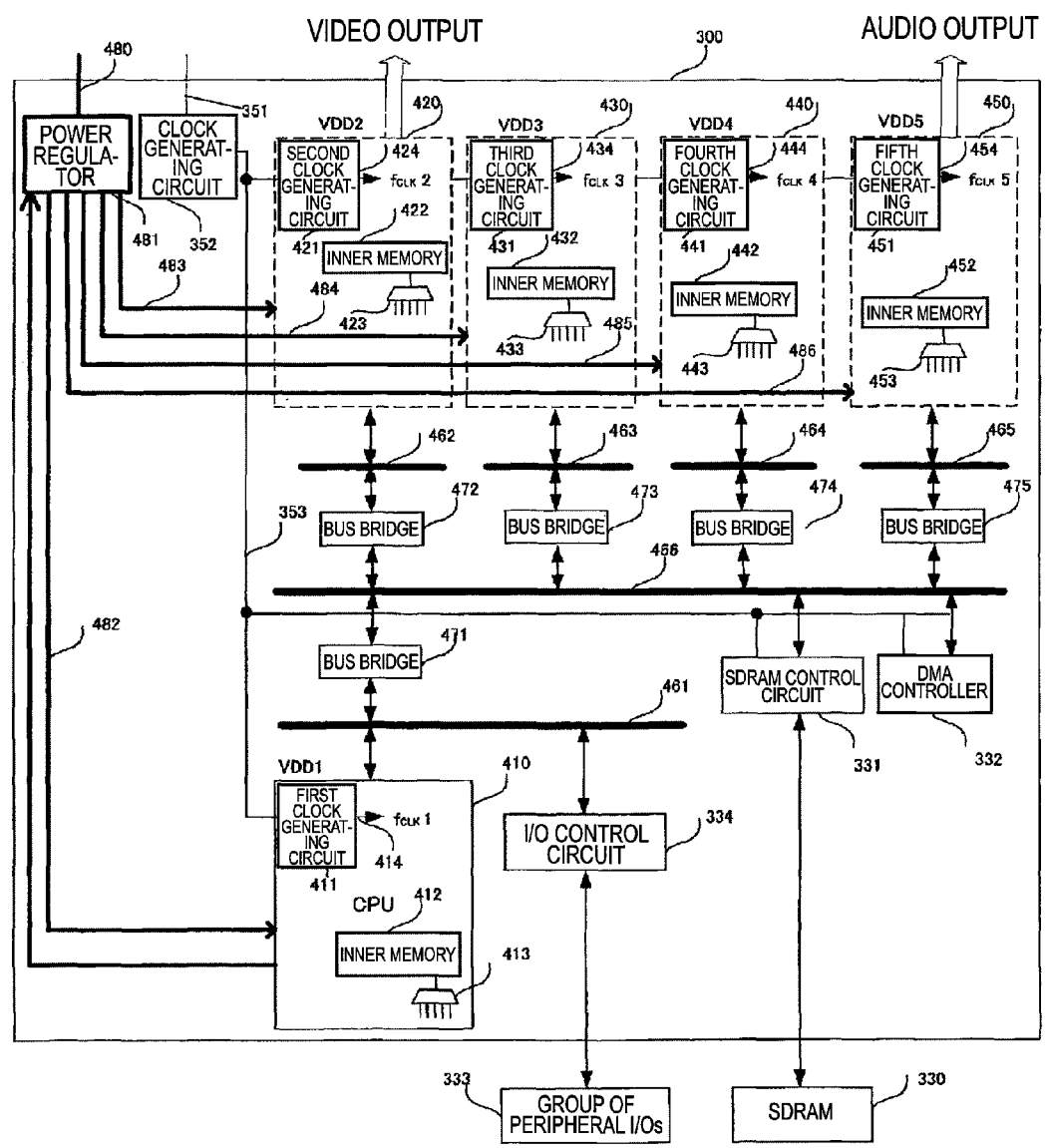
FIG. 4 is a block diagram when the first embodiment or the second embodiment is applied to the semiconductor integrated circuit on which a DVFS (Dynamic Voltage and Frequency Scaling) mechanism is mounted.

FIG. 4 is a circuit block diagram showing a structure obtained when the first embodiment or the second embodiment is applied to a semiconductor integrated circuit on which a DVFS (Dynamic Voltage and Frequency Scaling) mechanism is specifically mounted. Initially, the semiconductor integrated circuit 300 on which the DVFS (Dynamic Voltage and Frequency Scaling) mechanism is mounted will be described in detail. Then, a method for applying the present invention to the semiconductor integrated circuit on which the DVFS (Dynamic Voltage and Frequency Scaling) mechanism is mounted will be described.

In FIG. 4, the semiconductor integrated circuit 300 includes a first functional block 410 supposed to be a general-purpose CPU, a second functional block 420, a third functional block 430, a fourth functional block 440, a fifth functional block 450, an SDRAM control circuit 331 for controlling an SDRAM 330, a DMA controller 332, an I/O control circuit 334 for controlling a group of peripheral I/Os 333, a local bus 461 arranged in the side of the first functional block 410 and the I/O control circuit 334, a local bus 462 arranged in the second functional block 420 side, a local bus 463 arranged in the third functional block 430 side, a local bus 464 arranged in the fourth functional block 440 side, a local bus 465 arranged in the fifth functional block 450 side, a global bus 466 arranged between the local bus 461 and the local buses 462 to 465, a bus bridge 471 for connecting the local bus 461 to the global bus 466, a bus bridge 472 for connecting the local bus 462 to the global bus 466, a bus bridge 473 for connecting the local bus 463 to the global bus 466, a bus bridge 474 for connecting the local bus 464 to the global bus 466, a bus bridge 475 for connecting the local bus 465 to the global bus 466, a clock generating circuit 352 for generating sequentially multiplied clocks on the basis of an externally inputted clock 351 and a power regulator 481 for supplying a prescribed power to parts respectively on the basis of an external power source 480.

The first functional block 410 includes a first clock generating circuit 411 for generating a first system clock ($f_{CLK}1$) 414, a first inner memory 412 and a selector 413 for selecting any clock of the first system clock ($f_{CLK}1$) 414, a second system clock ($f_{CLK}2$) 424, a third system clock ($f_{CLK}3$) 434, a fourth system clock ($f_{CLK}4$) 444 and a fifth system clock ($f_{CLK}5$) 454 and supplying the system clock to the first inner memory 412.

Further, the second functional block 420 includes a second clock generating circuit 421 for generating the second system clock ($f_{CLK}2$) 424, a second inner memory 422 and a selector 423 for selecting any clock of the first system clock ($f_{CLK}1$) 414, the second system clock ($f_{CLK}2$) 424, the third system clock ($f_{CLK}3$) 434, the fourth system clock ($f_{CLK}4$) 444 and the fifth system clock ($f_{CLK}5$) 454 and supplying the system clock to the second inner memory 422.

The third functional block 430, the fourth functional block 440 and the fifth functional block 450 are constructed similarly to the first functional block 410 and the second functional block 420.

The clock generating circuit 352 generates a system clock 353 and supplies the generated system clock 353 respectively to the first clock generating circuit 411 in the first functional block 410, the second clock generating circuit 421 in the second functional block 420, a third clock generating circuit 431 in the third functional block 430, a fourth clock generating circuit 441 in the fourth functional block 440, a fifth clock generating circuit 451 in the fifth functional block 450, the SDRAM control circuit 331 and the DMA controller 332.

The first system clock ($f_{CLK}1$) 414 supplied to a circuit in the first functional block 410 is generated in the first clock generating circuit 411 provided in the first functional block 410. The second system clock ($f_{CLK}2$) 424 supplied to a circuit in the second functional block 420 is generated in the second clock generating circuit 421 provided in the second functional block 420. The third system clock ($f_{CLK}3$) 434 supplied to a circuit in the third functional block 430 is generated in the third clock generating circuit 431 provided in the third functional block 430. The fourth system clock ($f_{CLK}4$) 444 supplied to a circuit in the fourth functional block 440 is generated in the fourth clock generating circuit 441 provided in the fourth functional block 440. The fifth system clock ($f_{CLK}5$) 454 supplied to a circuit in the fifth functional block 450 is generated in the fifth clock generating circuit 451 provided in the fifth functional block 450.

Though not shown in FIG. 4, the first system clock 414 generated in the first clock generating circuit 411 in the first functional block 410 is supplied not only to the selector 413, but also to the selectors 423 to 453 provided in the second to the fifth functional blocks 420 to 450. This is the same for other system clocks.

The power regulator 481 wires a power cable 482 to the first functional block 410, a power cable 483 to the second functional block 420, a power cable 484 to the third functional block 430, a power cable 485 to the fourth functional block 440 and a power cable 486 to the fifth functional block 450, respectively.

In this embodiment, the association of an entire flow control is described on a main program stored in the inner memory 412 provided in the first functional block 410 supposed to be the general-purpose CPU. Processes related to an AV requiring a throughput are described on sub-programs stored in inner memories 422 to 452 provided in the second to the fifth functional blocks supposed to be multifunction DSPs. In this sense, it is the first functional block 410 supposed to be the general-purpose CPU that manages the entire work of the semiconductor integrated circuit 300.

Now, an operation of the semiconductor integrated circuit 300 constructed as described above will be described below.

In the first clock generating circuit 411 in the first functional block 410, the first system clock 414 is generated that is necessary for carrying out a calculation in which the throughput of the first functional block 410 changes depending on a time on the basis of the system clock 353 supplied to the semiconductor integrated circuit 300 by using an inner PLL circuit.

Similarly, in the second clock generating circuit 421 in the second functional block 420, the second system clock 424 is generated that is necessary for carrying out a calculation in which the throughput of the second functional block 420 changes depending on a time. In the third clock generating circuit 431 in the third functional block 430, the third system clock 434 is generated that is necessary for carrying out a calculation in which the throughput of the third functional block 430 changes depending on a time. Further, in the fourth clock generating circuit 441 in the fourth functional block 440, the fourth system clock 444 is generated that is necessary for carrying out a calculation in which the throughput of the fourth functional block 440 changes depending on a time. In the fifth clock generating circuit 451 in the fifth functional block 450, the fifth system clock 454 is generated that is necessary for carrying out a calculation in which the throughput of the fifth block 450 changes depending on a time.

The first functional block 410 as the general-purpose CPU has the inner memory 412 of a large capacity. A scheduler (not shown in the drawing) in the functional block 410 as the general-purpose CPU generally controls the operation of the entire part of the semiconductor integrated circuit 300. The scheduler is specifically realized by executing the main program by the general-purpose CPU.

The first functional block 410 includes below-described inf0ormation in the inner memory 412 in order to execute the main program and generally control the operation of the entire part of the semiconductor integrated circuit 300. Namely, the inner memory 412 of the first functional block 410 includes information concerning from what time, with what ability to do a work and what work volume of the work the second functional block 420 needs to carry out, at which frequency the second functional block 420 needs to operate for that purpose, and at which source voltage a source voltage needs to be set for the second functional block 420 to operate at that operating frequency, information concerning from what time, with what ability to do a work and what work volume of the work the third functional block 430 needs to carry out, at which frequency the third functional block 430 needs to operate for that purpose, and at which source voltage a source voltage needs to be set for the third functional block 430 to operate at that operating frequency, information concerning from what time, with what ability to do a work and what work volume of the work the fourth functional block 440 needs to carry out, at which frequency the fourth functional block 440 needs to operate for that purpose, and at which source voltage a source voltage needs to be set for the fourth functional block 440 to operate at that operating frequency and information concerning from what time, with what ability to do a work and what work volume of the work the fifth functional block 450 needs to carry out, at which frequency the fifth functional block 450 needs to operate for that purpose, and at which source voltage a source voltage needs to be set for the fifth functional block 450 to operate at that operating frequency.

The source voltages of the first functional block 410, the second functional block 420, the third functional block 430, the fourth functional block 440 and the fifth functional block 450 are generated in the incorporated power regulator 481. For the functional blocks respectively, the power cable 482 is wired to the first functional block 410, the power cable 483 is wired to the second functional block 420, the power cable 484 is wired to the third functional block 430, the power cable 485 is wired to the fourth functional block 440 and the power cable 486 is wired to the fifth functional block 450, respectively.

Figure 5:
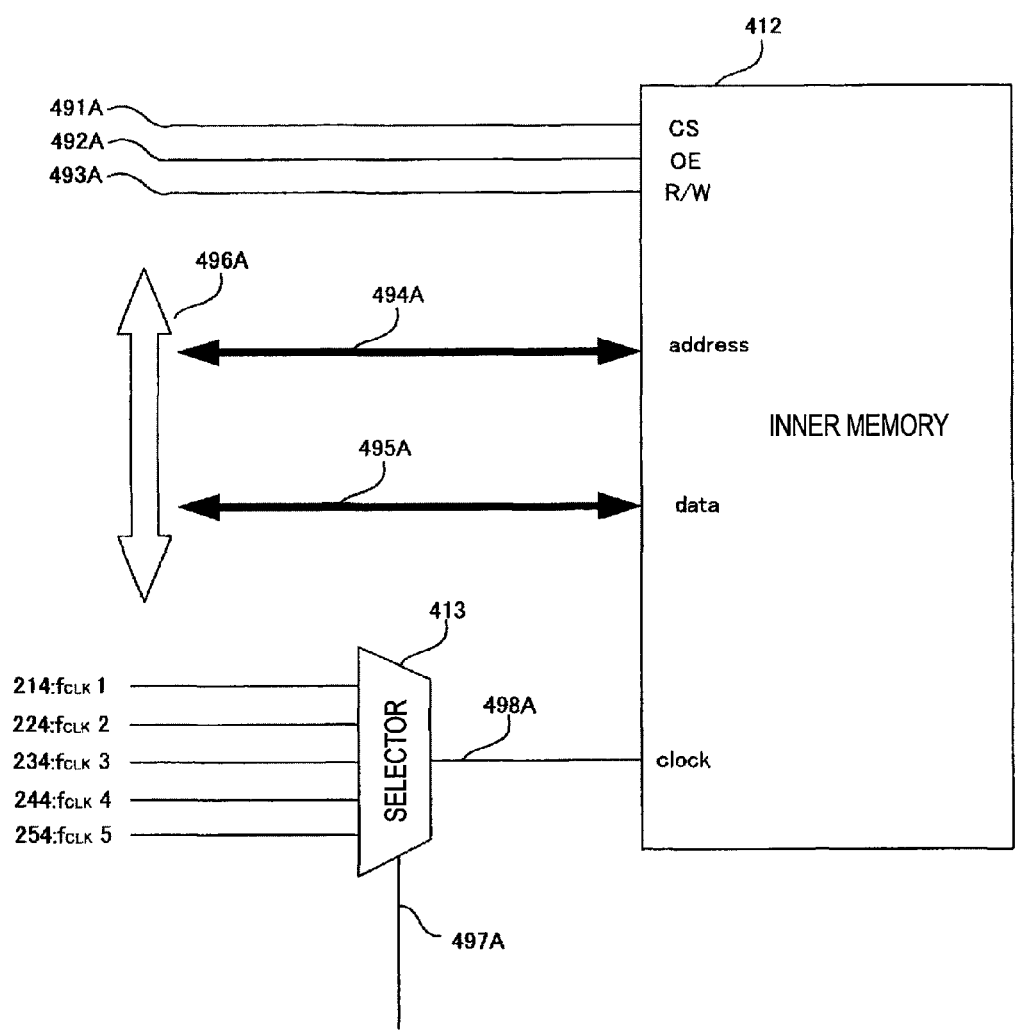
FIG. 5 is a diagram showing a connection of a first inner memory 412 in a first functional block 410.
Figure 6:
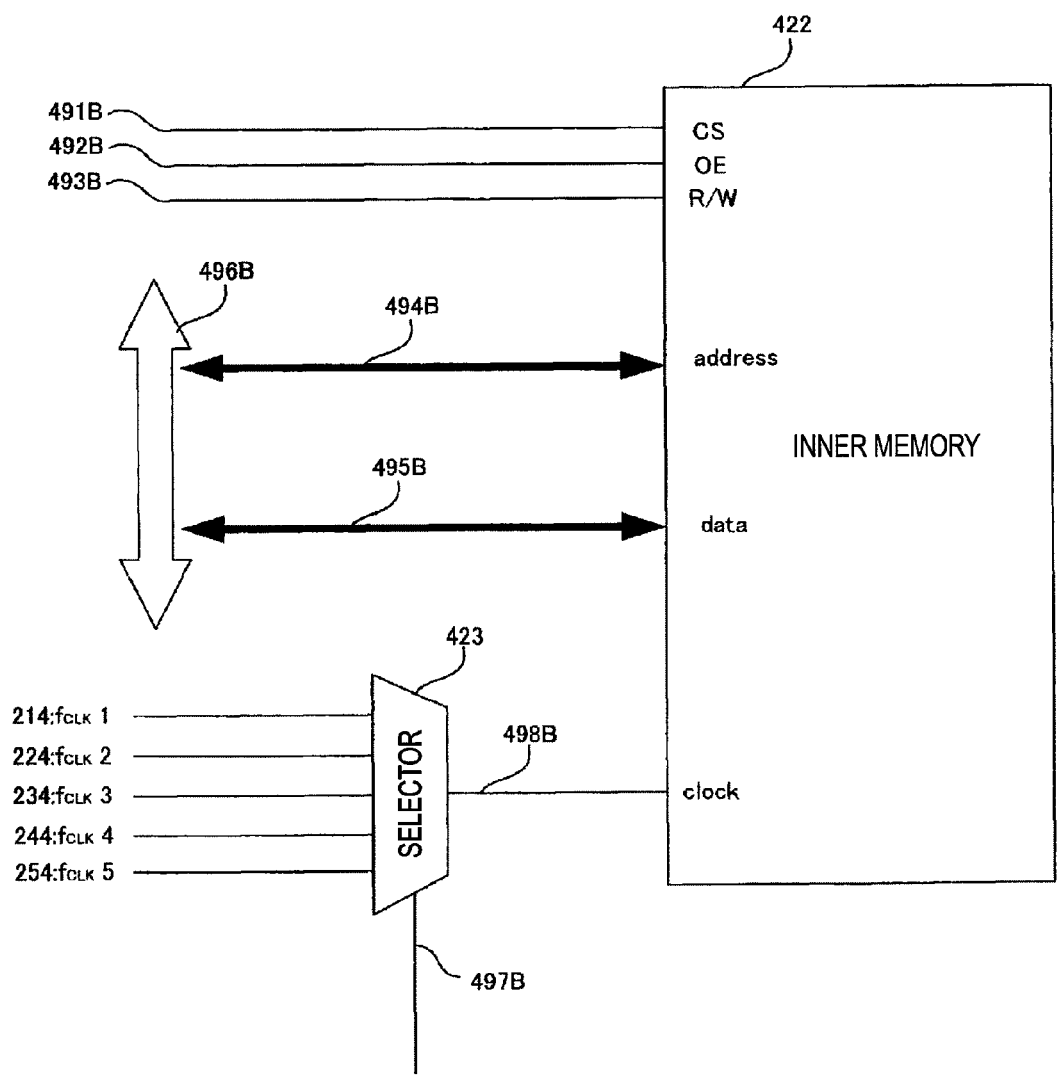
FIG. 6 is a diagram showing a connection of an inner memory in a second functional block of a semiconductor integrated circuit according to a third embodiment

FIG. 5 is a diagram showing a connection of the inner memory 412 in the first functional block 410. FIG. 6 is a diagram showing a connection of the second inner memory 422 in the second functional block 420.

In FIG. 5, reference numeral 412 designates the inner memory provided in the first functional block 410. Reference numeral 491A designates a chip select signal, reference numeral 492A designates an output enable signal, reference numeral 493A designates a read/write signal, reference numeral 494A designates an address signal, reference numeral 495A designates a data signal and reference numeral 496A designates a local bus. Reference numeral 414 designates the first system clock supplied to the circuit in the first functional block 410. Reference numeral 424 designates the second system clock supplied to the circuit in the second functional block 420. Reference numeral 434 designates the third system clock supplied to the circuit in the third functional block 430. Reference numeral 444 designates the fourth system clock supplied to the circuit in the fourth functional block 440. Reference numeral 454 designates the fifth system clock supplied to the circuit in the fifth functional block 450. Reference numeral 413 designates the selector. Reference numeral 497A designates a control signal of the selector 413. Reference numeral 498A designates any of the system clock signals of the first system clock 414 supplied to the circuit in the first functional block 410, the second system clock 424 supplied to the circuit in the second functional block 420, the third system clock 434 supplied to the circuit in the third functional block 430, the fourth system clock 444 supplied to the circuit in the fourth functional block 440, and the fifth system clock 454 supplied to the circuit in the fifth functional block 450.

Further, in FIG. 6, reference numeral 422 designates the inner memory provided in the second functional block 420. Reference numeral 491B designates a chip select signal, reference numeral 492B designates an output enable signal, reference numeral 493B designates a read/write signal, reference numeral 494B designates an address signal, reference numeral 495B designates a data signal and reference numeral 496B designates a local bus. Reference numeral 414 designates the first system clock supplied to the circuit in the first functional block 410. Reference numeral 424 designates the second system clock supplied to the circuit in the second functional block 420. Reference numeral 434 designates the third system clock supplied to the circuit in the third functional block 430. Reference numeral 444 designates the fourth system clock supplied to the circuit in the fourth functional block 440. Reference numeral 454 designates the fifth system clock supplied to the circuit in the fifth functional block 450. Reference numeral 423 designates the selector. Reference numeral 497B designates a control signal of the selector 423. Reference numeral 498B designates any of the system clock signals of the first system clock 414 supplied to the circuit in the first functional block 410, the second system clock 424 supplied to the circuit in the second functional block 420, the third system clock 434 supplied to the circuit in the third functional block 430, the fourth system clock 444 supplied to the circuit in the fourth functional block 440, and the fifth system clock 454 supplied to the circuit in the fifth functional block 450.

[Operation for Writing Data Signal in First Functional Block 410 in Inner Memory 422 in Second Functional Block 420]

When the first functional block 410 takes the initiative to write the data signal in the first functional block 410 in the inner memory 422 in the second functional block 420, after the first functional block recognizes that the inner memory 422 in the second functional block 420 is not used by the circuit in the second functional block 420, the first functional block controls the control signal 497B (see FIG. 6) of the selector 423 to set the system clock 498B to be the first system clock ($f_{CLK}1$) 414 supplied to the circuit in the first functional block 410. Then, the first functional block sets the chip select signal 491B to "H", the read/write signal 493B to a "write state" and the address signal 494B to the address of the inner memory 422 in the second functional block 420, controls the bus bridge 471 and the bus bridge 472 to transmit the data signal 495A in the first functional block 410 to the data signal 495B of the inner memory 422 in the second functional block 420 via the local bus 461, the global bus 466 and the local bus 462, and then, writes the data signal 495B in the inner memory 422 in the functional block 420.

[Operation for Reading Data Signal in Inner Memory 422 in Second Functional Block 420 to Inner Memory 412 in First Functional Block 410]

When the first functional block 410 takes the initiative to read the data signal in the inner memory 422 in the second functional block 420 to the first functional block 410, after the first functional block recognizes that the inner memory 422 in the second functional block 420 is not used by the circuit in the second functional block 420, the first functional block controls the control signal 497A (see FIG. 5) of the selector 413 to set the first system clock 414 supplied to the circuit in the first functional block 410 to be selected by the system clock 498A. Then, the first functional block sets the chip select signal 491A to "H", the read/write signal 493A to a "read state" and the address 494A of the inner memory 422 in the second functional block 420 to an address of an area desired to be read and controls the bus bridge 472 and the bus bridge 471 to read the data signal stored in the inner memory 422 in the second functional block 420 to the first functional block 410 via the local bus 462, the global bus 466 and the local bus 461.

Further, when the first functional block 410 takes the initiative to write the data signal in the second functional block 420 in the inner memory 412 inn the first functional block 410 or to read the data signal in the inner memory 412 in the first functional block 410 to the second functional block 420, the operation can be realized in the same manner as described above.

In the above-description, the operations are explained for writing and reading the data between the first functional block 410 and the second functional block 420. Further, operations can be similarly realized for writing and reading data between the first functional block 410, the second functional block 420, the third functional block 430, the fourth functional block 440 and the fifth functional block 450. However, in this embodiment, since the first functional block 410 is supposed to be the general-purpose CPU and other functional blocks than the first functional block 410 including the second functional block 420, the third functional block 430, the fourth functional block 440 and the fifth functional block 450 are supposed to be multifunction DSPs, in this embodiment, the general-purpose CPU that is the first functional block 410 manages the operation of the entire operation of the semiconductor integrated circuit 300 to the last. Accordingly, when the data is written and read between the first functional block 410, the second functional block 420, the third functional block 430, the fourth functional block 440 and the fifth functional block 450, the second functional block 420, the third functional block 430, the fourth functional block 440 and the fifth functional block 450 basically write and read the data between them in accordance with the instruction of the first functional block 410 as the general-purpose CPU under the control of the first functional block 410 as the general-purpose CPU.

Figure 7:
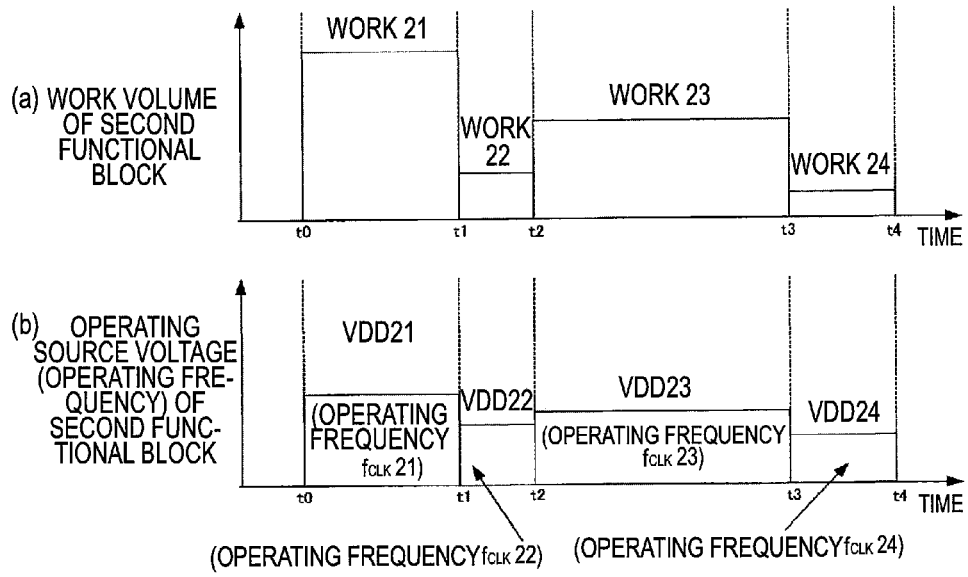
FIG. 7 is a diagram showing a dependence of the work volume of the second functional block 420 and the source voltage (operating frequency) of the second functional block 420 on the elapse of time.

FIG. 7 is a diagram showing a dependence of the work volume of the second functional block 420 and the source voltage (operating frequency) of the second functional block 420 on the elapse of time. Further, FIG. 8 is a diagram showing a dependence of the work volume of the first functional block 410 and the source voltage (operating frequency) of the first functional block 410 on the elapse of time.

As shown in examples of the work volume of the second functional block 420 in FIG. 7(*a*) and the operating source voltage of the second functional block 420 in FIG. 7(*b*), a schedule of works is managed by the first functional block 410 as the general-purpose CPU that the second functional block 420 carries out a work 21 during time from t0 to t1 under the source voltage VDD 21 and the operating frequency $f_{CLK}21$, a work 22 during time from t1 to t2 under the source voltage VDD 22 and the operating frequency $f_{CLK}22$, a work 23 during time from t2 to t3 under the source voltage VDD 23 and the operating frequency $f_{CLK}23$ and a work 24 during time from t3 to t4 under the source voltage VDD 24 and the operating frequency $f_{CLK}24$.

Figure 8:
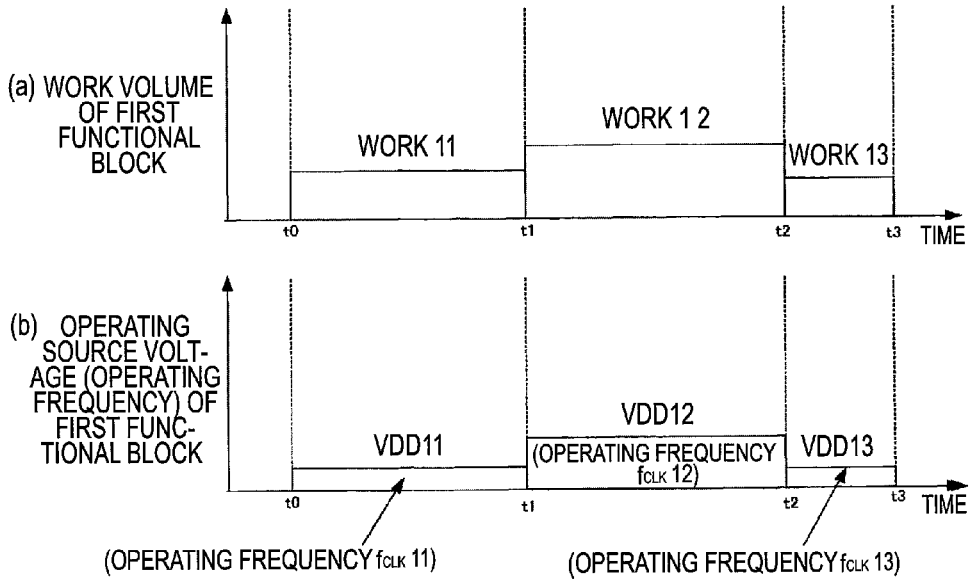
FIG. 8 is a diagram showing a dependence of the work volume of the first functional block 410 and the source voltage (operating frequency) of the first functional block 410 on the elapse of time.

As shown in examples of the work volume of the first functional block 410 in FIG. 8(*a*) and the operating source voltage of the first functional block 410 in FIG. 8(*b*), a schedule of works is managed by the first functional block 410 itself that the first functional block 410 carries out a work 11 during time from t0 to t1 under the source voltage VDD 11 and the operating frequency $f_{CLK}11$, a work 12 during time from t1 to t2 under the source voltage VDD 12 and the operating frequency $f_{CLK}12$ and a work 13 during time from t2 to t3 under the source voltage VDD 13 and the operating frequency $f_{CLK}13$.

As can be understood by comparing FIG. 7 with FIG. 8, the frequency of the first system clock 414 generated in the first clock generating circuit 411 in the first functional block 410 and supplied to the circuit in the first functional block 410 is determined depending on the calculation throughput of the work carried out in the first functional block 410. The frequency of the second system clock 424 generated in the second clock generating circuit 421 in the second functional block 420 and supplied to the circuit in the second functional block 420 is determined depending on the calculation throughput of the work carried out in the second functional block 420. Accordingly, a definite correlation does not exist between the frequency of the first system clock 414 generated in the first clock generating circuit 411 in the first functional block 410 and supplied to the circuit in the first functional block 410 and the frequency of the second system clock 424 generated in the second clock generating circuit 421 in the second functional block 420 and supplied to the circuit in the second functional block 420.

Figure 9:
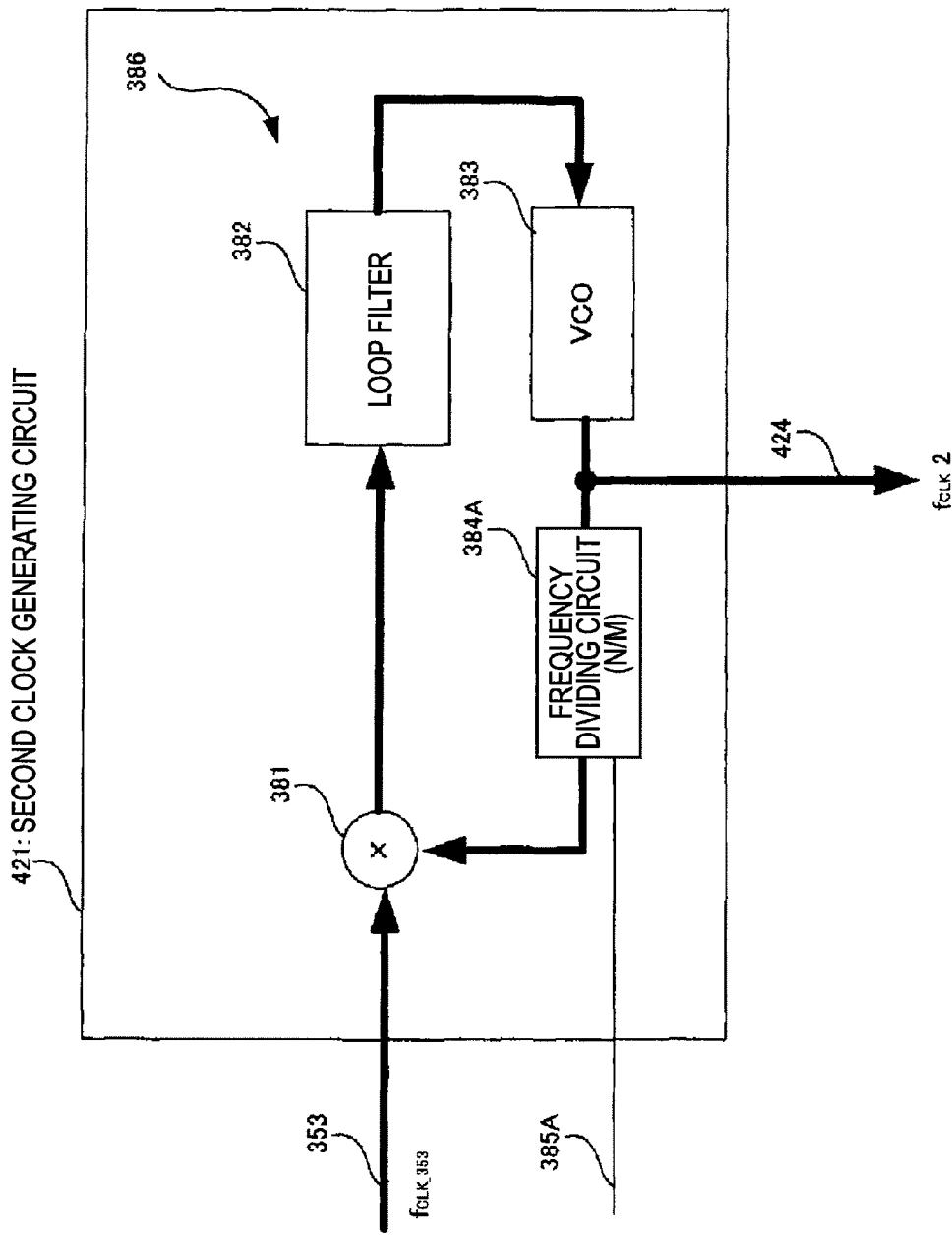
FIG. 9 is a block diagram showing the structure of a second clock generating circuit 421 in the second functional block 420.

FIG. 9 is a block diagram showing the structure of the second clock generating circuit 421 in the second functional block 420.

In FIG. 9, the second clock generating circuit 421 includes a phase detector 381 for comparing the phase of the system clock 353 generated in the clock generating circuit 352 with the phase of an output of a frequency dividing circuit, a loop filter 382, a VCO (Voltage Controlled Oscillator) 383, and a frequency dividing circuit 384A for dividing the frequency of an output signal from the VCO 383 into a frequency multiplied by N/M (in this case, M>N). Further, reference numeral 385A designates a control signal from the first functional block 410 supposed to be the general-purpose CPU. Reference numeral 424 designates the second system clock ($f_{CLK}2$) generated in the second clock generating circuit 421 in the second functional block 420.

The second clock generating circuit 421 forms a PLL (Phase-Locked Loop) circuit 386 and generates the second system clock 424 synchronizing with the system clock 353 generated in the clock generating circuit 352. Further, the operating frequency of the second system clock 424 can be set to a frequency desired by the control signal 385A from the first functional block 410 supposed to be the general-purpose CPU. For instance, assuming that the frequency of the system clock 353 generated in the clock generating circuit 352 is $f_{CLK-353}$, the frequency of the second system clock 424 synchronizing with the system clock 353 generated in the clock generating circuit 352 is $f_{CLK-424}$, and the frequency dividing ratio of the frequency of the output signal from the VCO 383 set by the control signal 385A from the first functional block 410 supposed to be the general-purpose CPU is N/M, a below-described relation is established.

$$f_{CLK-424} \times N/M = f_{CLK-353} \quad (1)$$

Accordingly, a relation of $$f_{CLK-424} = f_{CLK-353} \times M/N \quad (2)$$

is established.

By the above-described method, the system clock 424 generated in the second clock generating circuit 421 that is synchronous with the system clock 353 generated in the clock generating circuit 352 can be freely controlled by the control signal 385A from the first functional block 410 supposed to be the general-purpose CPU.

Figure 10:
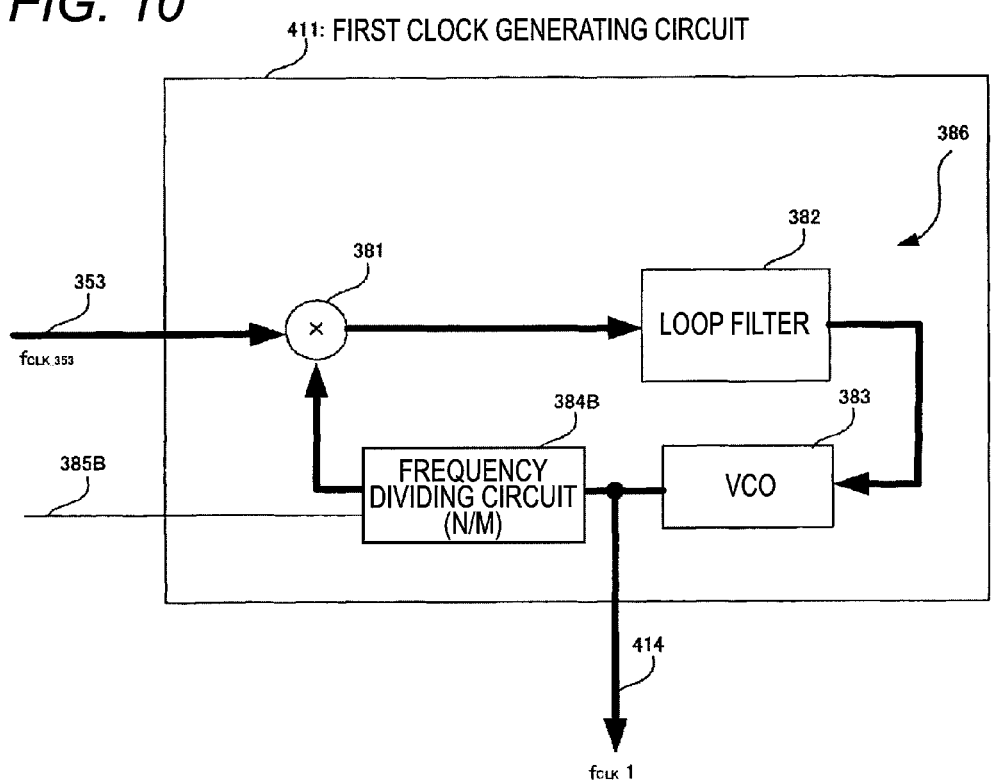
FIG. 10 is a block diagram showing the structure of a first clock generating circuit 411 in the first functional block 410.

FIG. 10 is a block diagram showing the structure of the first clock generating circuit 411 in the first functional block 410. The same components as those of FIG. 9 are designated by the same reference numerals.

The first clock generating circuit 411 has the same structure as that of the second clock generating circuit 421 except that a control signal 385B from the first functional block 410 in the second clock generating circuit 421 is a signal from the first functional block 410 itself.

The above-mentioned relations are summarized as follows. In the first clock generating circuit 411 provided in the first functional block 410, the first system clock 414 necessary for the first functional block 410 to carry out the work whose throughput changes depending on the time is generated from the system clock generating circuit 353 of the semiconductor integrated circuit 300 by using the first clock generating circuit 411. In the second clock generating circuit 421 provided in the second functional block 420, the second system clock 424 necessary for the second functional block 420 to carry out the work whose throughput changes depending on the time is generated from the system clock generating circuit 353 of the semiconductor integrated circuit 300 by using the second clock generating circuit 421.

The first functional block 410 as the general-purpose CPU has the first inner memory 412 of a large capacity. The first functional block 410 generally manages the entire operation of the semiconductor integrated circuit 300. In this embodiment, the first functional block 410 has a specific schedule about in what sequence and what work the second functional block 420 carries out in the inner memory 412 of the large capacity in the form of a program. Further, the first functional block 410 has information concerning from what time, with what ability to do a work and what work volume of the work the second functional block 420 needs to carry out, during a process for executing the program, at which frequency the second functional block 420 needs to operate for that purpose, and under which source voltage the second functional block 420 needs to operate at that operating frequency.

Now, how the first functional block 410 controls the source voltage and the operating frequency of the second functional block 420 will be specifically described below.

What work the second functional block 420 carries out is described in the inner memory 412 of the first functional block 410 in the form of an operating program. The first functional block 410 reads that the second functional block 420 carries out the work 21 from the time t0 (see FIG. 7) in accordance with the operating program. Then, the first functional block 410 reads the source voltage VDD 21, the operating frequency $f_{CLK}$ 21 and M/N described in the equation (2) that are suitable for the work 21 from Table 5 stored in a specific area different from the operating program.

TABLE 5

| Contents of work | Source voltage | Operating frequency | M/N |
|---|---|---|---|
| Work 11 | VDD 11 | $f_{LCK}$11 | 3 |
| Work 12 | VDD 12 | $F_{LCK}$12 | 5 |
| Work 13 | VDD 13 | $f_{LCK}$13 | 2 |
| Work 14 | VDD 14 | $f_{LCK}$14 | 2 |
| Work 15 | VDD 15 | $f_{LCK}$15 | 2 |
| Work 16 | VDD 16 | $f_{LCK}$16 | 5 |
| Work 17 | VDD 17 | $f_{LCK}$17 | 3 |
| Work 18 | VDD 18 | $f_{LCK}$18 | 7 |
| Work 19 | VDD 19 | $f_{LCK}$19 | 6 |
| Work 21 | VDD 21 | $f_{LCK}$21 | 15 |
| Work 22 | VDD 22 | $f_{LCK}$22 | 9 |
| Work 23 | VDD 23 | $f_{LCK}$23 | 13 |
| Work 24 | VDD 24 | $f_{LCK}$24 | 7 |
| Work 25 | VDD 25 | $f_{LCK}$25 | 21 |
| Work 26 | VDD 26 | $f_{LCK}$26 | 8 |
| Work 27 | VDD 27 | $f_{LCK}$27 | 18 |
| Work 28 | VDD 28 | $f_{LCK}$28 | 7 |
| Work 29 | VDD 29 | $f_{LCK}$29 | 11 |

This Table 5 is determined by previously investigating respectively the contents of the works described in the operating program and in accordance with a minute and careful simulation about which frequencies are necessary and to which source voltages the source voltage needs to be set for that when the multifunction DSP of the second functional block 420 is allowed to carry out the works respectively.

Then, the first functional block 410 initially instructs the incorporated power regulator 481 to supply the source voltage VDD 2 to the second functional block 420.

Then, the first functional block 410 writes a proper specific value of M/N in the circuit for dividing the frequency of the output signal from the VCO 383 of the second clock generating circuit 421 into a frequency multiplied by N/M (in this case, M>N) through the control signal 385 shown in FIG. 9. The second clock generating circuit 421 is set to the stable operating frequency $f_{CLK}$2 after the elapse of a set-up time of the PLL circuit 386. Since a time necessary for the above-described setting operation is less than a time necessary for the work 21, the time is not shown in FIG. 7.

After the elapse of a time necessary for obtaining the stable source voltage VDD 2 and the operating frequency $f_{CLK}$2 of the second functional block 420, since the first functional block 410 permits the second functional block 420 to start the work 21, the second functional block 420 starts the work 21.

When the second functional block 420 completes the work 21, the second functional block 420 reports "information of the completion of the work 21" to the first functional block 410 that manages all the works. A method may be, of course, used that when the second functional block 420 completes the work 21, in place of reporting the "information of the completion of the work 21" to the first functional block 410 managing all the works, the second functional block 420 records the "information of the completion of the work 21" in a specific register as a flag and the first functional block 410 watches the register.

In the above-description, for the multifunction DSP, to what source voltage the source voltage is set and to what operating frequency the operating frequency is set correspondingly to the contents of the works respectively are determined by the previous minute and careful simulation. When the operating frequency is supposed to be constant during carrying out a certain work, to provide a margin in the operation of the multifunction DSP, a margin needs to be provided in the value of the operating source voltage. At this time, two points need to be mainly taken into consideration.

(1) Unevenness of Delay Path
(2) Secured Temperature Range

Initially, an unevenness of delay paths will be described below. When the inner circuit of the block of each multifunction DSP is examined, as will be described in FIG. 11, the delay paths in this circuit have various values. The value of the source voltage necessary for carrying out a specific work in the multifunction DSP is determined by a group of the delay paths referred to as a critical path among the various delay paths existing in the functional block. Accordingly, the source voltages of all inner circuits of the block of the multifunction DSP do not need to be raised. As shown in FIG. 1, it is effective from the viewpoint of reducing a consumed electric power to raise only the source voltage VDDH 151 of the combined circuit 104 forming the critical path. Further, in the critical path, since the value of the source voltage VDDH 151 required for ensuring a certain delay margin is also different depending on a degree of delay, it is advantageous to set required values respectively. Since it is of course undesirable to generate too many source voltage values in the power regulator shown in FIG. 4, the source voltage value VDDH supplied to the combined circuit 104 of the critical path is set to five stages of a source voltage value VDDH-lowlow, a source voltage value VDDH-low, a source voltage value VDDH-normal, a source voltage value VDDH-high and a source voltage value VDDH-highhigh, as shown in FIG. 3, and preferably set to six source voltage values including the source voltage value VDDL supplied to other parts than the combined circuit 104 of the critical path.

Figure 18:
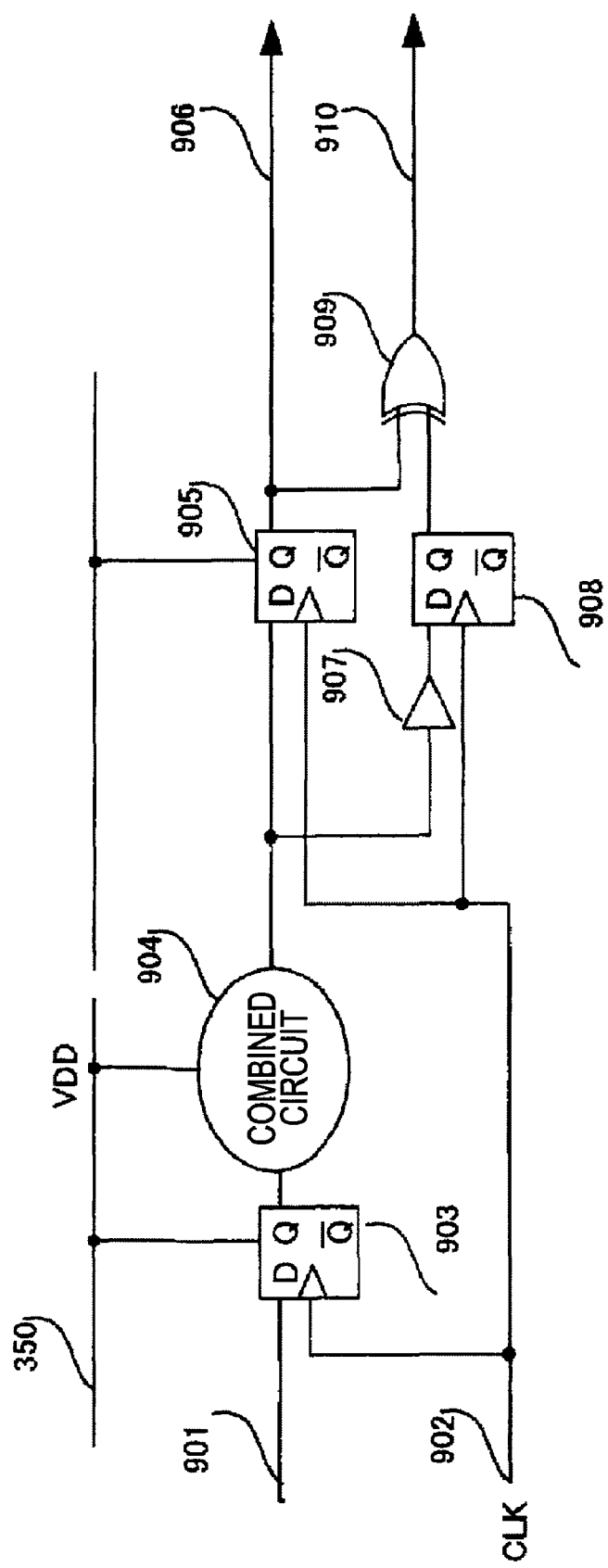
FIG. 18 is a block diagram showing that a circuit diagram of a canary FF is applied to a usual critical path.

Now, a secured temperature range will be described below. In a semiconductor technology of a deep sub-micron area, it has been difficult to design a semiconductor integrated circuit that has usually considered the worst case. The circuit using the canary FF shown in FIG. 18 is one example of a structure that makes it possible to design not the semiconductor integrated circuit considering the worst case, but the integrated circuit in a typical case. This method improves a method by a Razor circuit formerly devised, however, has the problems as described in the problem 1 and the problem 2. The first embodiment and the second embodiment shown in FIG. 1 and FIG. 2 more improve the usual method by the canary FF and show the structures that can realize a required design margin of the semiconductor integrated circuit as small as possible. The above-described structures can effectively reduce the consumed electric power.

A part enclosed by a black thick frame in FIG. 3 shows a part of the power regulator 481 illustrated in FIG. 4. The power cables 202, 203, 204, 205 and 206 of the source voltage value VDDH-lowlow, the source voltage value VDDH-low, the source voltage value VDDH-normal, the source voltage value VDDH-high and the source voltage value VDDH-highhigh shown in FIG. 3 and the switch part 207 for switching the source voltage value VDDH supplied to the level shifter 152 and the combined circuit 104 in accordance with the combination of the value of the compared result signal 110, the value of the compared result signal 114, the value of the compared result signal 118 and the value of the compared result signal 122 as shown in the Table 3 and the Table 4 may be respectively laid out in the vicinity of the critical paths or in a suitable position of the multifunction block and can be designed to be concentrically managed together in one place of the semiconductor integrated circuit.

For instance, from the power regulator 481 shown in FIG. 4, the source voltages VDDL and VDDH can be supplied to the first functional block 410 by wiring the power cable 482, to the second functional block 420 by wiring the power cable 483, to the third functional block 430 by wiring the power cable 484, to the fourth functional block 440 by wiring the power cable 485, and to the fifth functional block 450 by wiring the power cable 486.

When the circuit enclosed by the thick frame shown in FIG. 3 is laid out in the vicinity of the critical paths respectively, a plurality of power cables need to be respectively wired from the power regulator 481 shown in FIG. 4 to parts near the critical paths. In this case, the number of the power cables to be wired needs to be reduced as small as possible in view of a space. Thus, a below-described contrivance is made.

Figure 11:
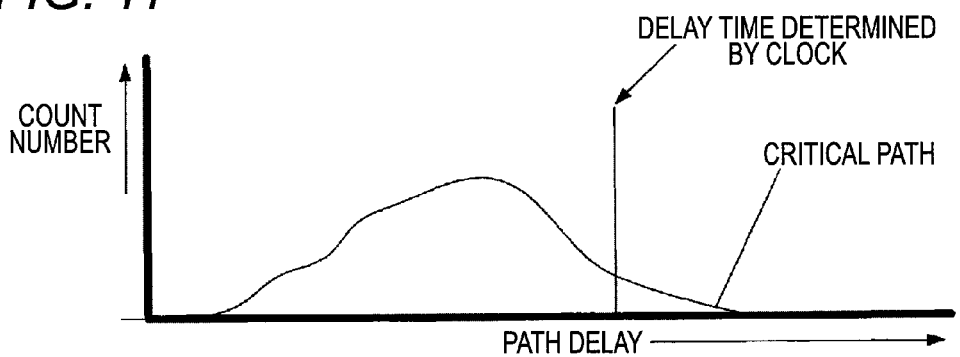
FIG. 11 is a diagram showing the path delay of a delay path and a count number.

In FIG. 11, a value of path delay in the source voltage value VDDL in the multifunction DSP block is shown in an axis of abscissas and the corresponding count number of the value of path delay is shown in an axis of ordinates. In FIG. 11, a delay time determined by a clock frequency supplied to the multifunction DSP block is shown by a vertical line in FIG. 11. When the value of path delay is larger than the time shown by the vertical line in FIG. 11, the critical path is formed, and the source voltage value VDDH having a value higher than the source voltage value VDDL to the combined circuit 104 of the critical path to reduce a delay time. In this case, since the source voltage value VDDH supplied to the combined circuit 104 of the critical path is higher than the source voltage value VDDL supplied to the flip-flop 103, the level shifter 152 is inserted between the flip-flop 103 and the combined circuit 104.

As can be understood from FIG. 11, the critical path has a difference in the value of path delay, so that the difference of about three stages is supposed to exist depending on the strictness of the delay time so that the strictness is met. Accordingly, the source voltages VDDH supplied to the combined circuit 104 of the critical path is supposed to have the five stages of voltages including the source voltage value VDDH-lowlow, the source voltage value VDDH-low, the source voltage value VDDH-normal, the source voltage value VDDH-high and the source voltage value VDDH-highhigh. As specific values, for instance, the values of the source voltage value VDDL, the source voltage value VDDH-lowlow, the source voltage value VDDH-low, the source voltage value VDDH-normal, the source voltage value VDDH-high and the source voltage value VDDH-highhigh are respectively 1.0 V, 1.10 V, 1.15 V, 1.20 V, 1.25 V and 1.30 V.

Figure 12:
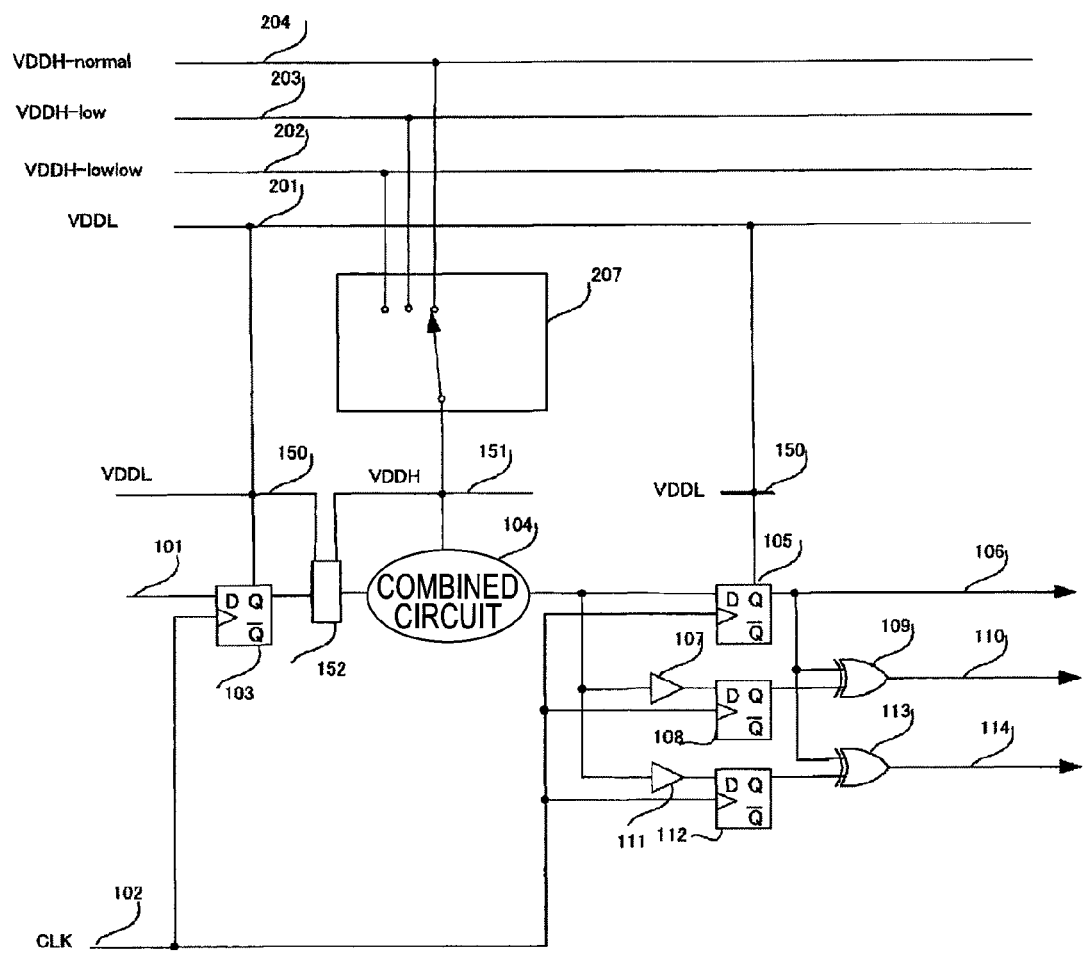
FIG. 12 is a circuit diagram for selecting three stages of voltages of a source voltage value VDDH-lowlow, a source voltage value VDDH-low and a source voltage value VDDH-normal when a degree of delay of a critical path is low.
Figure 13:
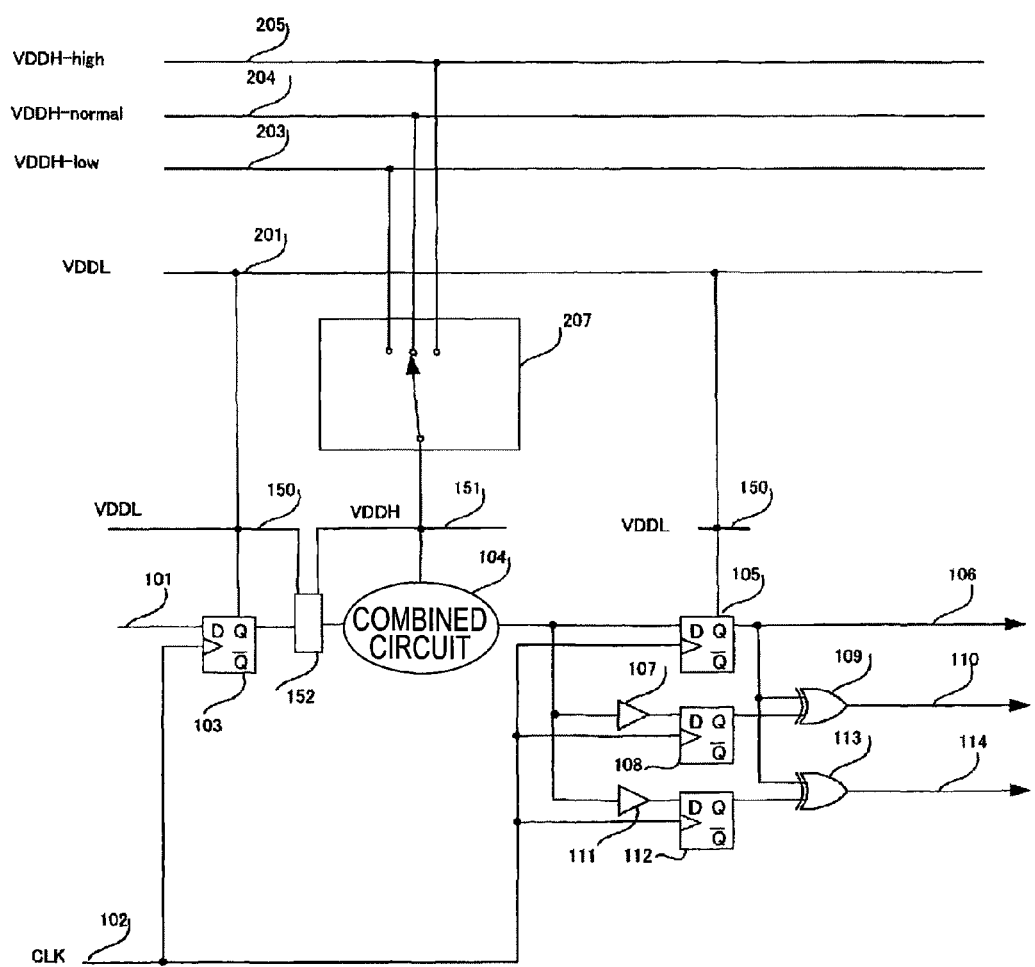
FIG. 13 is a circuit diagram for selecting three stages of voltages of a source voltage value VDDH-low, a source voltage value VDDH-normal and a source voltage value VDDH-high when a degree of delay of the critical path is intermediate.
Figure 14:
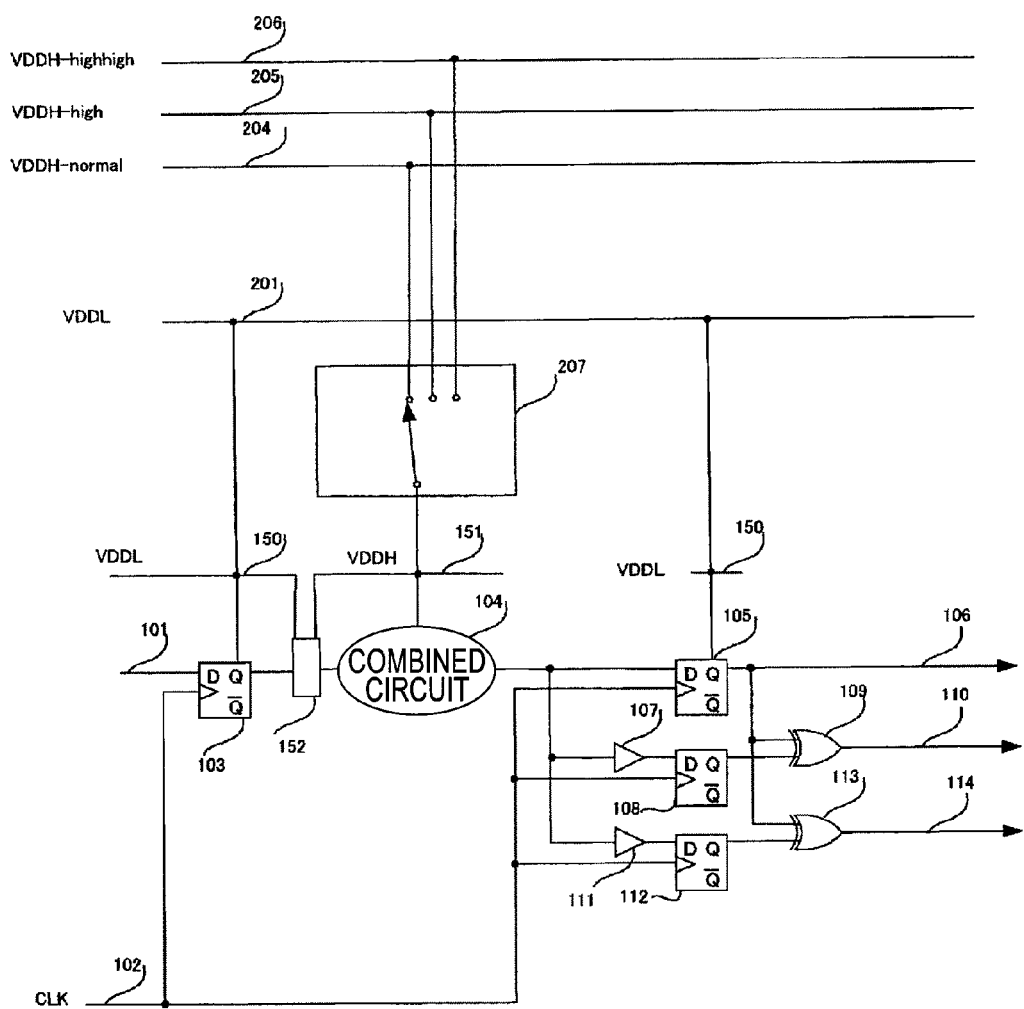
FIG. 14 is a circuit diagram for selecting three stages of voltages of a source voltage value VDDH-normal, a source voltage value VDDH-high and a source voltage value VDDH-highhigh when a degree of delay of the critical path is intermediate.
Figure 15:
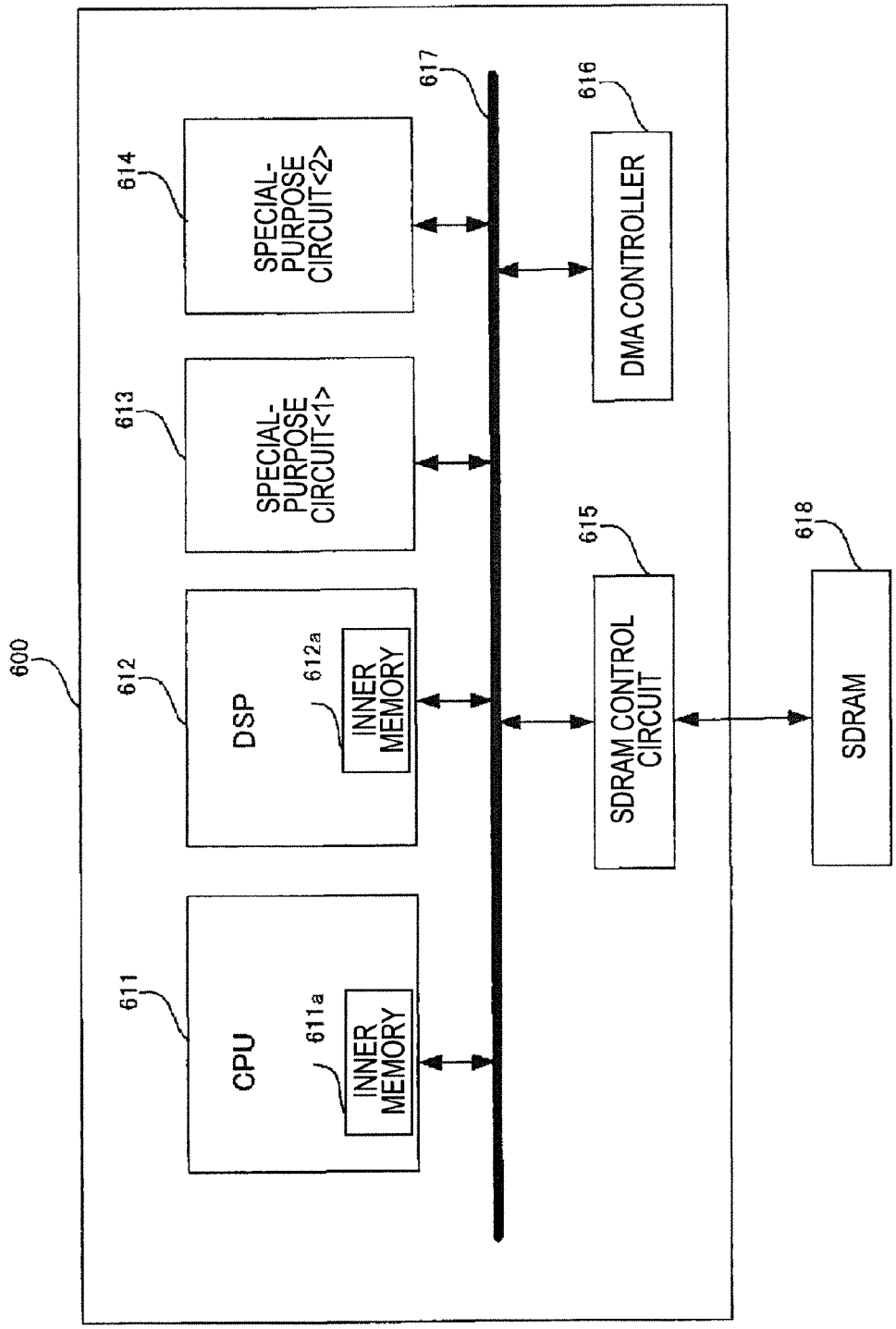
FIG. 15 is a block diagram of a usual system LSI.
Figure 16:
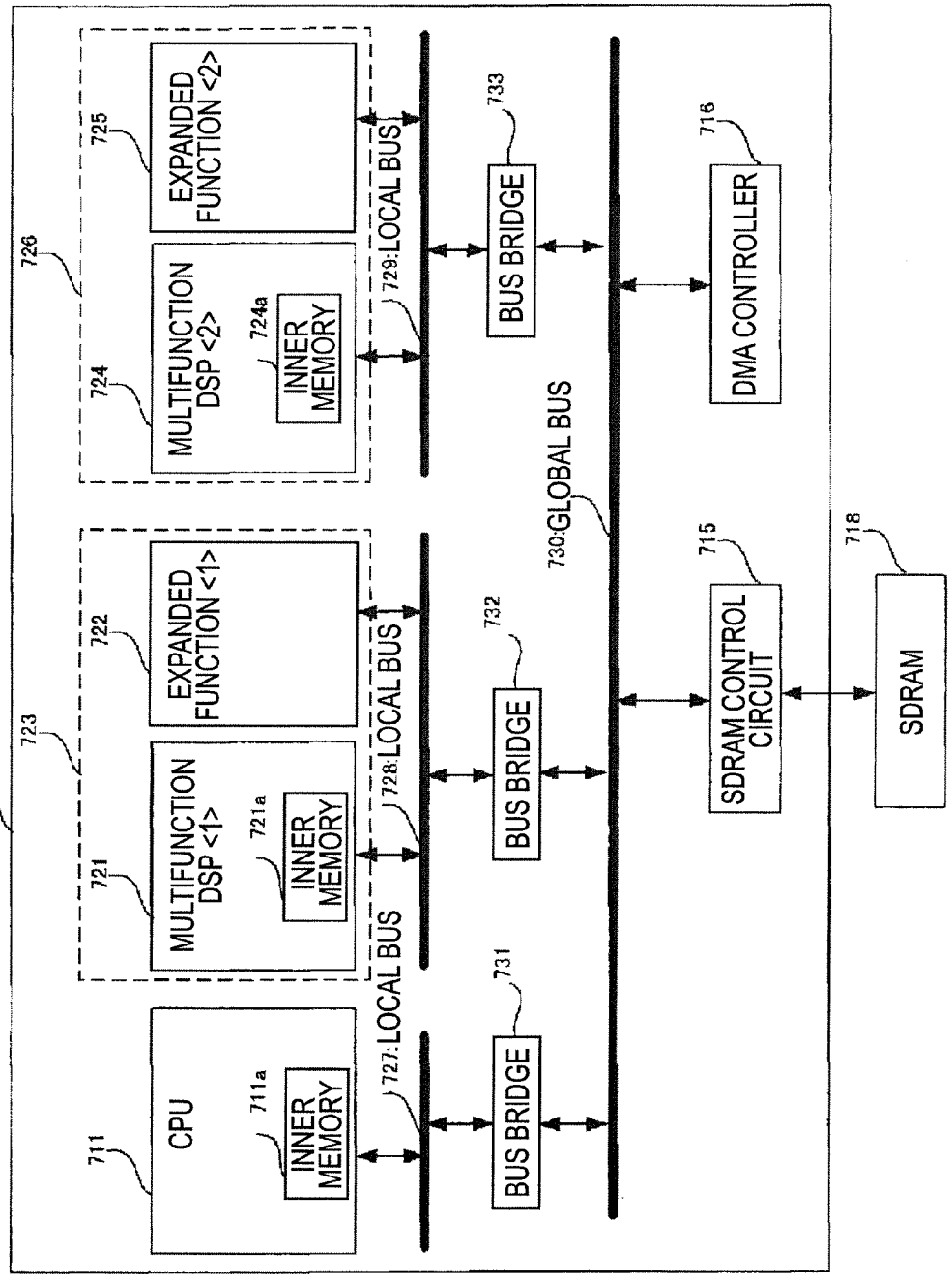
FIG. 16 is a block diagram of a usual system LSI.
Figure 17:
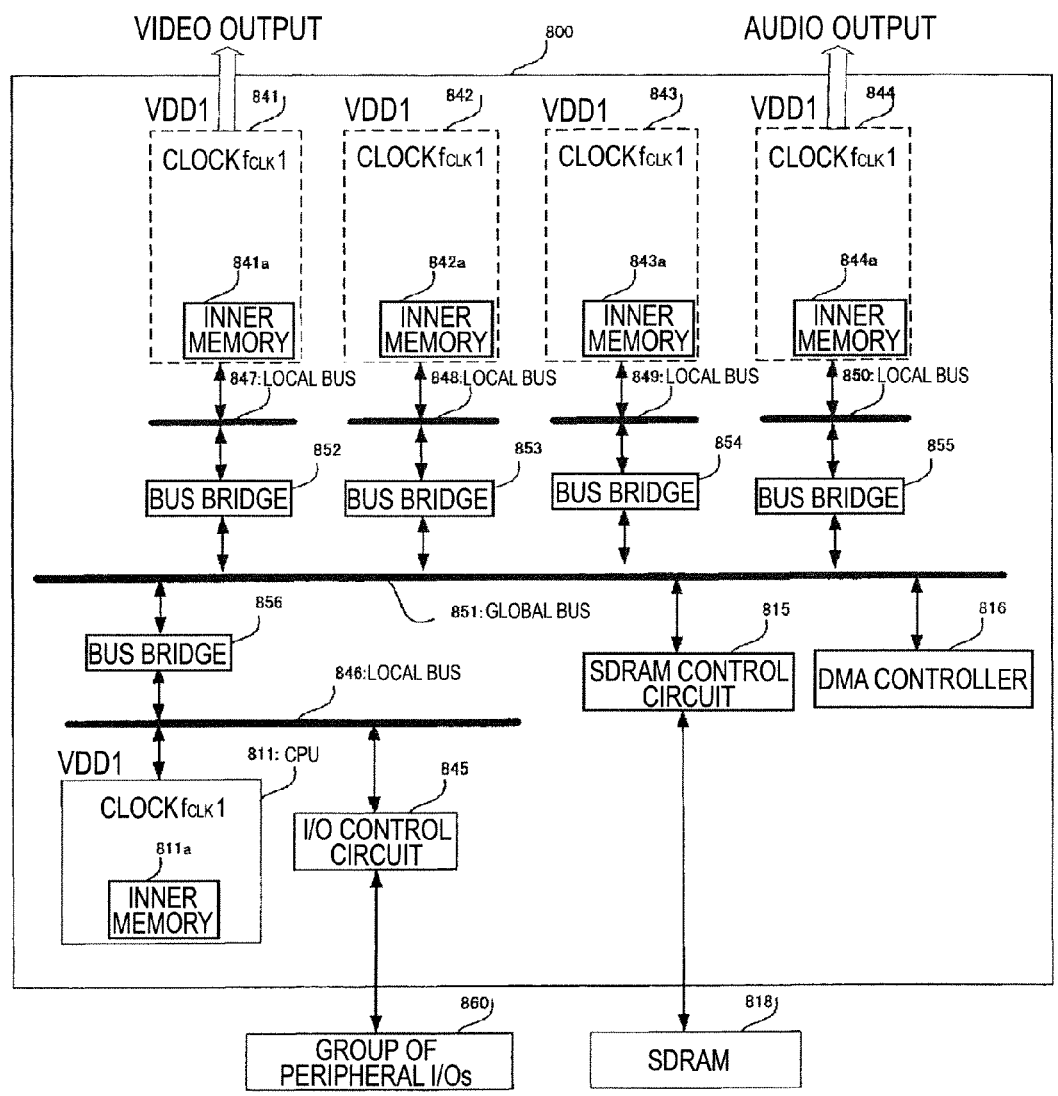
FIG. 17 is a block diagram of a usual system LSI.

Repeatedly described, the critical path has a difference in the value of path delay. To the critical path whose degree of delay is low, the three stages of voltages including the source voltage value VDDH-lowlow, the source voltage value VDDH-low and the source voltage value VDDH-normal can be set so as to select. To the critical path whose degree of delay is intermediate, the three stages of voltages including the source voltage value VDDH-low, the source voltage value VDDH-normal and the source voltage value VDDH-high can be set so as to select. To the critical path whose degree of delay is high, the three stages of voltages including the source voltage value VDDH-normal, the source voltage value VDDH-high and the source voltage value VDDH-highhigh can be set so as to select. In FIG. 12, FIG. 13 and FIG. 14, the above-described cases are respectively shown. Since the source voltage value VDDH includes the three-stages of voltages in the critical paths respectively, the two canary FFs as shown in FIG. 1 are adequately provided.

As an initial value, intermediate source potentials in the respective cases are designed so as to obtain the case of (2) in the Table 2. Specifically, for the critical path whose degree of delay is low, the initial value of the source voltage value VDDH is designed to be set to the source voltage value VDDH-low. For the critical path whose degree of delay is intermediate, the initial value of the source voltage value VDDH is designed to be set to the source voltage value VDDH-normal. For the critical path whose degree of delay is high, the initial value of the source voltage value VDDH is designed to be set to the source voltage value VDDH-high.

For instance, in a certain critical path, the degree of delay of the critical path is supposed to be intermediate and the source voltage value VDDH is supposed to be designed to have the case of (2) in the Table 2. However, actually, the case of (1) in the Table 2 is supposed to be obtained. At this time, since the value of the compared result signal 110 is "1" and the value of the compared result signal 114 is "1", a control operates so as to "raise the source voltage value VDDH". Thus, the source voltage value VDDH is changed to the source voltage value VDDH-high from the source voltage value VDDH-normal set as the initial value.

Similarly, in a certain critical path, the degree of delay of the critical path is supposed to be intermediate and the source voltage value VDDH is supposed to be designed to have the case of (2) in the Table 2. However, actually, the case of (3) in the Table 2 is supposed to be obtained. At this time, since the value of the compared result signal 110 is "0" and the value of the compared result signal 114 is "0", a control operates so as to "lower the source voltage value VDDH". Thus, the source voltage value VDDH is changed to the source voltage value VDDH-low from the source voltage value VDDH-normal set as the initial value. Whatever causes exist that generate the delay of the critical path, the structure of the present invention includes a function for automatically adjust a margin of the delay of the critical path to a prescribed value.

When the consumed electric power in the work of the multifunction DSP is tried to be reduced, the source voltage value of the multifunction DSP to be set may be set to the lowest value that can pass at all costs the critical path whose delay value is the largest. However, it is very difficult to determine such a subtle setting even by a previous minute and careful simulation.

A plurality of canary FFs are used respectively for the critical paths. Thus, it can be recognized whether a delay margin in a present circuit is lower, proper or higher relative to a desired value. This information is used for controlling respectively the source voltages of the combined circuits of the critical paths to be "raised", "held" and "lowered", so that the DVS (Dynamic Voltage Scaling) technique and the AVS (Adaptive Voltage Scaling) technique suitable for reducing the consumed electric power can be realized.

The above-description merely exemplifies the preferred embodiments of the present invention and a scope of the present invention is not limited thereto.

In the above-mentioned third embodiment, one example of the semiconductor integrated circuit is described that utilizes the first embodiment or the second embodiment of the present invention. However, the semiconductor integrated circuit utilizing the first embodiment or the second embodiment of the present invention is not limited to the third embodiment.

For instance, in the third embodiment, all of the second functional block to the fifth functional block are defined as the "multifunction DSPs". However, a certain functional block mainly carries out only a process of a calculation and may not sometimes correspond to a generally called "DSP".

Further, as the functional block supposed to be the "multifunction block DSP", a description is given to a case having the four functional blocks of the second functional block to the fifth functional block. However, it is to be understood that the number is not limited to four.

The semiconductor integrated circuit according to the present invention is effectively employed for reducing the consumed electric power of the semiconductor integrated circuit using the AVS (Adaptive Voltage Scaling) technique or the DVS (Dynamic Voltage Scaling) technique.

What is claimed is:

1. A semiconductor integrated circuit, comprising:
   a first flip-flop, a combined circuit and a second flip-flop that are connected in series;
   a first delay circuit and a third flip-flop connected in series that are provided in parallel with the second flip-flop in the post-stage of the combined circuit;
   a second delay circuit and a fourth flip-flop connected in series that are provided in parallel with the second flip-flop in the post-stage of the combined circuit;
   a first comparison circuit that compares the output of the second flip-flop with the output of the third flip-flop;
   a second comparison circuit that compares the output of the second flip-flop with the output of the fourth flip-flop; and
   a control circuit that controls a source voltage supplied to the combined circuit in accordance with the output of the first comparison circuit and the output of the second comparison circuit, wherein the first delay circuit outputs a signal inputted from the combined circuit after a first delay time and the second delay circuit outputs a signal inputted from the combined circuit after a second delay time different from the first delay time.

2. The semiconductor integrated circuit according to claim 1, wherein the first delay time is a value 5% to 30% as long as a delay time from the first flip-flop to the second flip-flop.

3. The semiconductor integrated circuit according to claim 2, wherein the second delay time is a value 105% to 130% as long as the first delay time.

4. The semiconductor integrated circuit according to claim 1, wherein when the output of the first comparison circuit shows a "mismatch" of two input signals and the output of the second comparison circuit shows a "mismatch" of two input signals, the control circuit controls the source voltage supplied to the combined circuit to be raised.

5. The semiconductor integrated circuit according to claim 1, when the output of the first comparison circuit shows a "match" of the two input signals and the output of the second comparison circuit shows a "mismatch" of the two input signals, the control circuit controls the source voltage supplied to the combined circuit to be held.

6. The semiconductor integrated circuit according to claim 1, when the output of the first comparison circuit shows a "match" of the two input signals and the output of the second comparison circuit shows a "match" of the two input signals, the control circuit controls the source voltage supplied to the combined circuit to be lowered.

7. The semiconductor integrated circuit according to claim 1, wherein an equal source voltage is supplied to the first flip-flop and the second flip flop and the source voltage is lower than the source voltage supplied to the combined circuit.

8. The semiconductor integrated circuit according to claim 1, wherein the control circuit controls the source voltage supplied to the combined circuit to be "raised", "held or "lowered".

9. The semiconductor integrated circuit according to claim 8, wherein the control circuit sets the initialization of the source voltage supplied to the combined circuit to be "held".

10. The semiconductor integrated circuit according to claim 1, further comprising:
    a third delay circuit and a fifth flip-flop connected in series that are provided in parallel with the second flip-flop in the post-stage of the combined circuit;
    a fourth delay circuit and a sixth flip-flop connected in series that are provided in parallel with the second flip-flop in the post-stage of the combined circuit;
    a third comparison circuit that compares the output of the second flip-flop with the output of the fifth flip-flop; and
    a fourth comparison circuit that compares the output of the second flip-flop with the output of the sixth flip-flop:
    wherein the control circuit controls the source voltage supplied to the combined circuit in accordance with the output of the first comparison circuit, the output of the second comparison circuit, the output of the third comparison circuit and the output of the fourth comparison circuit and the first delay time, the second delay time, a third delay time by the third delay circuit and a fourth delay time by the fourth delay circuit are respectively different.

* * * * *